US012677605B2

(12) United States Patent
Loh et al.

(10) Patent No.: US 12,677,605 B2
(45) Date of Patent: Jul. 7, 2026

(54) REUSABLE TEMPLATES FOR SEMICONDUCTOR DESIGN AND FABRICATION

(71) Applicant: ADVANCED MICRO DEVICES, INC., Santa Clara, CA (US)

(72) Inventors: Gabriel H. Loh, Bellevue, WA (US); Todd David Basso, Boxborough, MA (US); Steven Tu, Austin, TX (US); Joshua A. Hort, Boxborough, MA (US); Chia-Ken Leong, Santa Clara, CA (US); Benjamin Beker, Austin, TX (US); Anwar P. Kashem, Boxborough, MA (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 645 days.

(21) Appl. No.: 18/065,816

(22) Filed: Dec. 14, 2022

(65) Prior Publication Data

US 2024/0203736 A1     Jun. 20, 2024

(51) Int. Cl.
| | |
|---|---|
| *H10P 14/40* | (2026.01) |
| *H10P 72/70* | (2026.01) |
| *H10W 70/60* | (2026.01) |
| *H10W 70/65* | (2026.01) |
| *H10W 72/00* | (2026.01) |

(52) U.S. Cl.
CPC ............. *H10P 14/40* (2026.01); *H10P 72/74* (2026.01)

(58) Field of Classification Search
CPC ......................... H01L 23/49816; H01L 23/50; H01L 23/5386
See application file for complete search history.

(56) References Cited

U.S. PATENT DOCUMENTS

| | | | |
|---|---|---|---|
| 10,935,593 B2 * | 3/2021 | Goyal | G01R 23/20 |
| 11,830,817 B2 * | 11/2023 | Agarwal | H10W 70/611 |
| 12,353,305 B2 * | 7/2025 | Choudhary | G06F 11/263 |
| 12,481,614 B2 * | 11/2025 | Das Sharma | G06F 13/4221 |
| 2017/0200672 A1 | 7/2017 | Jayasena et al. | |
| 2020/0365571 A1 * | 11/2020 | Chen | H01L 23/3128 |
| 2021/0050318 A1 | 2/2021 | Marquart et al. | |
| 2021/0193567 A1 | 6/2021 | Cheah et al. | |
| 2021/0398906 A1 * | 12/2021 | Qian | H01L 23/5386 |
| 2021/0407942 A1 * | 12/2021 | Yu | H01L 24/19 |
| 2022/0052006 A1 * | 2/2022 | Kang | H01L 24/14 |
| 2022/0052009 A1 * | 2/2022 | Huang | H01L 21/486 |
| 2022/0237138 A1 | 7/2022 | Lanka et al. | |
| 2022/0302002 A1 * | 9/2022 | Kim | H01L 23/5384 |
| 2022/0310470 A1 * | 9/2022 | Chen | H01L 25/0652 |

FOREIGN PATENT DOCUMENTS

WO     2024129923 A1     6/2024

OTHER PUBLICATIONS

International Search Report and Written Opinion, PCT/US2023/083929, mailed Apr. 11, 2024, 11 pages.

* cited by examiner

*Primary Examiner* — Mohsen Ahmadi

(57)     ABSTRACT

A substrate includes a location for coupling one or more chiplets to the substrate. The location has dimensions that bound dimensions of chiplets capable of being coupled to the substrate in the location. Additionally, the location includes an interface region having connections for one or more die-to-die interfaces of the one or more chiplets and a power region that includes a power interface having connections for the one or more chiplets.

16 Claims, 9 Drawing Sheets

Obtain First Location For Coupling First Chiplet To Substrate
1205

Obtain Second Location For Coupling Second Chiplet To Substrate
1210

Generate Layout File For Substrate Based On First Location And Second Location
1215

Store Layout File
1220

Form Substrate Based On The Layout File
1225

Receive Input From User Specifying Dimensions Of Substrate, A First Location, And A Second Location
1305

Generate Template From Received Input
1310

Store Template In A Repository
1315

Receive A Layout File Based On A Template
1405

Form Connections In A First Location
1410

Form Power Connections And Interface Connections In A Second Location
1415

Form Traces Between Connections Of The First Location And The Interface Connections Of
The Second Location
1420

REUSABLE TEMPLATES FOR SEMICONDUCTOR DESIGN AND FABRICATION

BACKGROUND

When forming semiconductor assemblies, a variety of chiplets can be coupled to a substrate and to each other. Different chiplets often have different dimensions, involving different dimensions for connections on a substrate for the different chiplets. Conventionally, a substrate for a semiconductor assembly is designed for a specific combination of chiplets, resulting in customized design and manufacture of a substrate for each combination of chiplets used.

DETAILED DESCRIPTION

Figure 1:
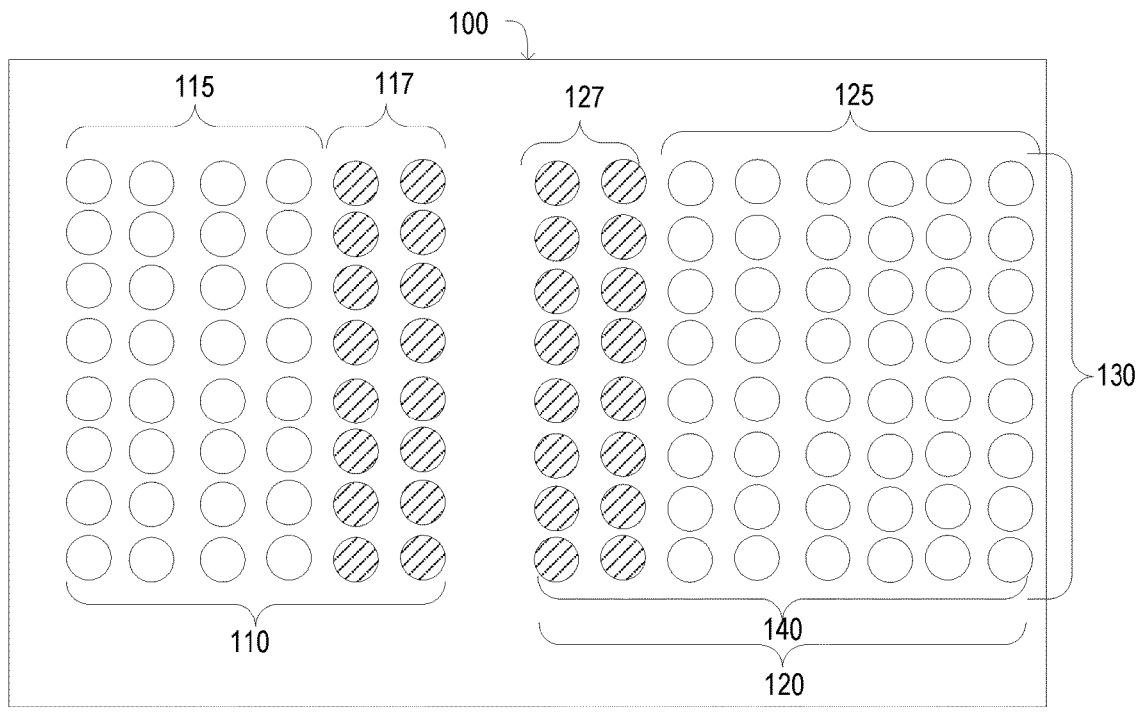
FIG. 1 is an example reusable template according to some implementations disclosed herein.

Different chiplets that are coupled together to form a semiconductor assembly have different dimensions (e.g., lengths and widths). When designing a semiconductor assembly, a combination of chiplets and the positions of those chiplets relative to each other are used to determine dimensions and placement of interfaces between each chiplet and a substrate. This involves designing a unique substrate for each configuration of chiplets for different semiconductor assemblies. Such individualized design of a substrate for each semiconductor assembly increases an amount of time to manufacture different semiconductor assemblies by incorporating additional time to create a specific substrate design for different dimensions of chiplets and different relative positions of chiplets in different semiconductor assemblies. Further, such individualized design of semiconductor assembly-specific substrates prevents substrates from being reused for different semiconductor assemblies, increasing manufacturing costs and manufacturing times for different semiconductor assemblies.

While efforts have been made to provide electrical specifications applicable across a range of chiplets, conventional efforts have not addressed differing dimensions for interfaces of different chiplets. This lack of standardization for chiplet sizing results in designing a unique package substrate for different combinations of chiplets and different positions of chiplets relative to each other on the package substrate. Further, while maintaining multiple locations on a substrate having identical dimensions provides some flexibility in chiplets capable of being coupled to the substrate, maintaining common dimensions for each location prevents variation in dimensions for different chiplets to be coupled to the substrate.

To allow reuse of a substrate design with multiple chiplets that have different dimensions, the present specification describes various implementations of templates for substrates. The term 'template' as used here generally refers to a data structure or structures (such as a file or files) that specifies a layout of a substrate including locations of connectors on the substrate and routing information for connections between connectors, such as conductive traces coupling connectors in one location of the substrate to connectors in another location of the substrate. Other design information for the substrate is included in the template in various implementations. A substrate formed from the template includes locations for a number of chiplets to be coupled to the substrate in various implementations. Such a template can be utilized as a foundation in a design process of particular semiconductor package that includes the substrate and various other components. For example, a single template can be used to design and manufacture different semiconductor assemblies that include different chiplets with different dimensions coupled to a particular location of the substrate. This allows different chiplets having different dimensions to be coupled to the particular location of a substrate, providing greater flexibility in semiconductor assembly design. Additionally, fabricating a substrate from a template allows a common substrate to be reused for chiplets having different dimensions rather than fabricating a specific substrate to accommodate specific dimensions of different chiplets.

In some implementations, a template has a first location for coupling a first chiplet to a substrate and a second location for coupling one or more additional chiplets to the substrate. The second location includes an interface region on the substrate and a power region that includes a power interface. The power interface includes connections for the one or more additional chiplets. This allows a substrate formed using a particular template to include multiple additional chiplets that have dimensions that do not exceed the dimensions of the second location. In this way, a template allows reuse of a substrate layout across multiple designs, providing increased flexibility for coupling additional chiplets having different sizes to a substrate fabricated from a template.

In some implementations, a substrate includes a location for coupling one or more chiplets to the substrate, the location having dimensions that bound dimensions of additional chiplets capable of being coupled to the substrate in the location. The location includes an interface region including connections for one or more die-to-die interfaces of the one or more chiplets and a power region that includes a power interface having connections for the one or more chiplets. In some implementations, the substrate includes an additional location for coupling a first chiplet to the substrate, the additional location including connections for coupling the first chiplet to the substrate. In some implementations, the substrate includes connections between the interface region in the location and an interface region in the additional location.

In some implementations, a chiplet has dimensions that do not exceed dimensions of the location. A width of the chiplet does not exceed a width of the location in some implementations. In some implementations, a length of the chiplet does not exceed a length of the location. In some implementations, a combined width of a plurality of chiplets does not exceed a width of the location. In some implementations, a combined length of a plurality of chiplets does not exceed a length of the location.

In some implementations, wherein the location includes a sideband region, and the substrate includes connections between the sideband region and a second sideband region in a different location, for a sideband interface between a chiplet in the location and another chiplet in the different location, the sideband interface augmenting a die-to-die interface. In some implementations, the location includes an external connection including connections coupling an a chiplet to one or more components external to a semiconductor assembly including the substrate, and the substrate includes a connection pathway from a connection in the external connection region to an outside connection.

The specification further describes a semiconductor assembly including a substrate. The substrate includes a location for coupling one or more chiplets to the substrate, the location having dimensions that bound dimensions of additional chiplets capable of being coupled to the substrate in the location. The location includes an interface region including connections for one or more die-to-die interfaces of the one or more chiplets and a power region that includes a power interface having connections for the one or more chiplets. The semiconductor assembly also includes at least one chiplet coupled to at least a subset of the connections in the interface region and to a subset of the connections in the power region, where the at least one chiplet having dimensions that do not exceed dimensions of the location.

In various implementations, the substrate further includes an additional location for coupling a first chiplet to the substrate, where the additional location includes connections for coupling the first chiplet to the substrate. In some implementations, the semiconductor assembly includes the first chiplet coupled to the additional location.

In some implementations, the at least one chiplet comprises a plurality of chiplets, and a combined width of the plurality of chiplets does not exceed a width of the location. In various implementations, the at least one chiplet comprises a plurality of chiplet and a combined length of the plurality of chiplets does not exceed a length of the location. In some implementations, a subset of the connections in the power region of the location are not coupled to a chiplet. In various implementations, a subset of connections in the interface region of the second location are not coupled to a chiplet.

In some implementations, the location includes a sideband region, and the substrate includes connections between the sideband region and a second sideband region in a different location, for a sideband interface between a chiplet in the location and another chiplet in the different location, where the sideband interface augments a die-to-die interface, and where a chiplet is coupled to one or more connections in the sideband region. In various implementations, the location includes an external connection including connections coupling an a chiplet to one or more components external to a semiconductor assembly including the substrate, and the substrate includes a connection pathway from a connection in the external connection region to an outside connection.

In another implementation, a method for fabricating a semiconductor assembly includes obtaining a first location for coupling a first chiplet to a substrate and obtaining a second location for coupling one or more additional chiplets to the substrate. The second location includes an interface region on the substrate for connections for one or more die-to-die interfaces between the first chiplet and the one or more additional chiplets and a power region on the substrate within the second location for a power interface including connections for the one or more additional chiplets, and dimensions for the power interface. The method further includes generating a layout file for the substrate based on the selected template.

In some implementations, the input from the user further identifies a specialized interface region within the first location and a specialized interface region within the interface region of the second location for a second die-to-die interface having one or more characteristics.

The following disclosure provides many different implementations, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows include implementations in which the first and second features are formed in direct contact, and also include implementations in which additional features formed between the first and second features, such that the first and second features are in direct contact. Further, spatially relative terms, such as "beneath," "below," "lower," "above," "upper," "back," "front," "top," "bottom," and the like, are used herein for ease of description to describe one element or feature's relationship to another element(s) or feature(s) as illustrated in the figures. Similarly, terms such as "front surface" and "back surface" or "top surface" and "back surface" are used herein to identify various components more easily, and identify that those components are, for example, on opposing sides of another component. The spatially relative terms are intended to encompass different orientations of the device in use or operation in addition to the orientation depicted in the figures.

FIG. 1 is an overhead view of a graphical representation of a template 100 for a substrate of a semiconductor assembly. In aspects, a graphical representation of a template (such as those shown in FIGS. 1-8) can be rendered on a display in a graphical user interface of an EDA tool or other application. For purposes of simplicity, the graphical representation of each of the layouts will be referred to here as the template itself. The template 100 includes a first location 110 on the substrate where a first chiplet is to be coupled to the substrate. Similarly, the template 100 includes a second location 120 on the substrate where one or more additional chiplets are to be coupled to the substrate. As further described herein, additional chiplets having dimensions that do not exceed dimensions of the second location 120 are capable of being coupled to the substrate in the second location 120, allowing different additional chiplets having different dimensions to be coupled to a substrate fabricated based on the template 100.

In various implementations, the template 100 includes data describing dimensions of a substrate (e.g., a length and a width of the substrate) and different locations within the substrate. The first location 110 has a length and a width that are specified by the template 100. For example, the template 100 includes coordinates for the first location 110 relative to a reference point of the substrate, such as coordinates for corners of the first location 110 relative to a specific corner of the substrate; however, in other implementations, the template 100 identifies the first location 110 within the substrate using any suitable reference point or description of dimensions of the first location. Similarly, the second location 120 has a length and a width that are specified by the template 100. For example, the template 100 includes coordinates for the second location 120 relative to a reference point of the substrate, such as coordinates for corners of the second location 120 relative to a specific corner of the substrate. In other implementations, the template 100 specifies coordinates for the second location 120 relative to a location of the first location 110 on the substrate. However, in other implementations, the template 100 identifies the second location 120 within the substrate using any suitable reference point or description of dimensions of the first location 110.

The first location 110 where the first chiplet is to be coupled to the substrate in template 100 includes an interface region 117 specifying a location on the substrate for connections for one or more die-to-die interfaces. A die-to-die interface included in the first chiplet couples the first chiplet to one or more additional chiplets that are also coupled to the substrate, with the substrate including electrical connections between the interface region 117 within the first location 110 for the first chiplet and one or more interface regions 127 in a second location 120 on the substrate where one or more additional chiplets are coupled to the substrate as specified by template 100. Hence, connections of interface region 117 within the first location 110 on the substrate are coupled to one or more connections of interface regions 127 of the second location 120 to allow communication between a chiplet or chiplets in the second location 120 and a first chiplet in the first location 110. The template 100 specifies positions on the substrate for the interface region 117 to couple the die-to-die interface of the first chiplet to the substrate and specifies positions on the substrate where die-to-die interfaces of one or more additional chiplets are coupled to the substrate in the interface regions 127 within the second location 120. In various implementations, the connections on the substrate for coupling to the die-to-die interfaces of the first chiplet and to additional chiplets are solder bumps. The interface region 117 and the interface regions 127 specify a density of the solder bumps, number, and arrangement of the solder bumps, and/or a spacing between the solder bumps in various implementations.

The first location 110 on the substrate specified for the first chiplet also includes a power region 115 that includes connections between the first chiplet and power and ground planes (not shown here). Thus, the power region 115 specifies a location within the substrate of connections to provide power to the first chiplet through the substrate. In various implementations, the connections providing power to the first chiplet are solder bumps. In some implementations, the power region 115 in the first location 110 includes connections between the first chiplet and other signals. For example, a first set of connections in the power region 115 couple the first chiplet to a power plane and to a ground plane, while a second set of connections in the power region 115 connect the first chiplet to other signals or to other components. The power region 115 specifies a density of the solder bumps or a spacing between the solder bumps in various implementations. In other implementations, different connections are used in the power region 115. Example connections include conductive pillars, pins, pads, one or more silicon bridges, one or more silicon interposers, and integrated fan-out (InFO) connections.

The second location 120 on the substrate also includes a power region 125. The power region 125 specifies a location on the substrate for coupling a power interface of one or more additional chiplets to power via the substrate. In various implementations, the connections providing power to the one or more additional chiplets are solder bumps, with the substrate including solder bumps in the second location specified by the power region 125. The power region 125 specifies a density of the solder bumps or a spacing between the solder bumps in various implementations. Other connectors are used to provide power, ground, or signals to a chiplet in different implementations. Example connections include conductive pillars, pins, pads, one or more silicon bridges, one or more silicon interposers, and InFO connections.

Figure 2:
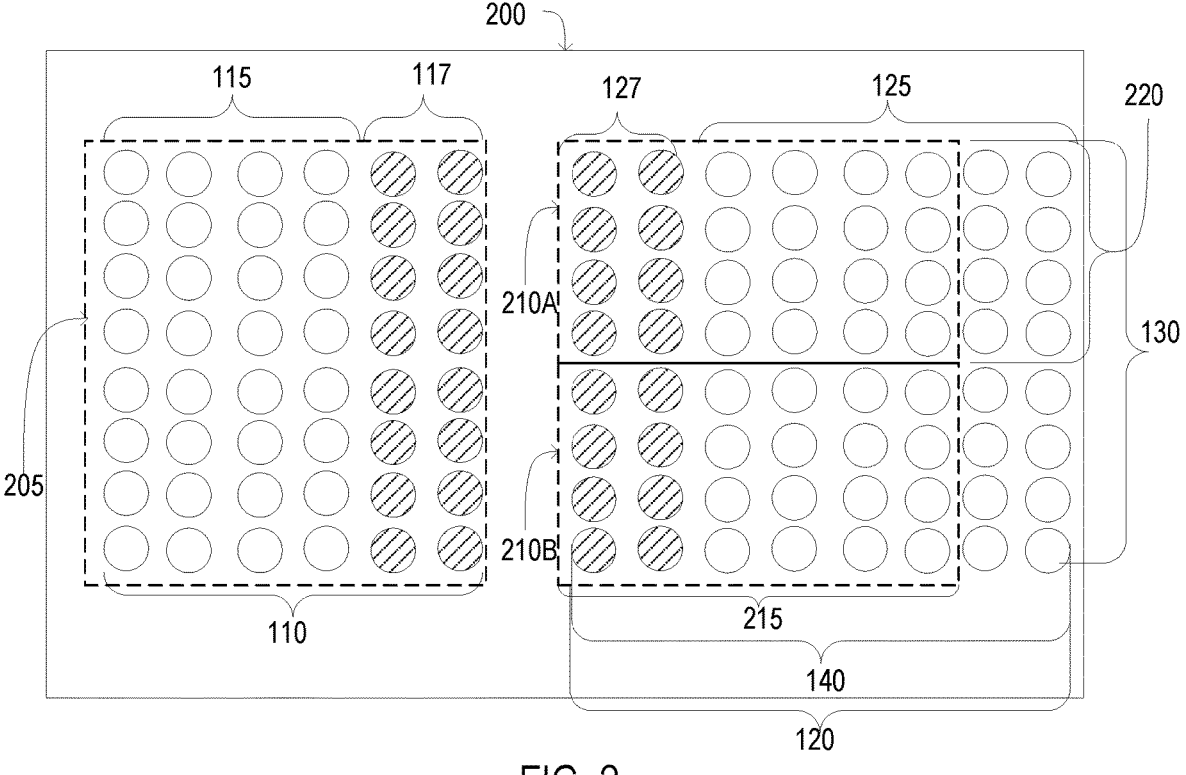
FIG. 2 depicts a design of a semiconductor assembly based on a template according to some implementations.

The template 100 specifies one or more dimensions of both the interface region 127 and of the power region 125. Different templates 100 are capable of including various dimensions of both or either location. The term "dimension" here refers to any combination of length, width, height, spacing between connections, density of connections, size of connections, type of connections, and the like. For purposes of illustration, FIG. 2 shows the second location 120 for coupling the one or more additional chiplets to the substrate with a length 140 and a width 130. Other templates 100 have a different width for the power region 125, a different length for the power region 125, or a different width and a different length for the power region 125, with the differing dimensions resulting in corresponding differences in a length and a width of the second location 120. In various implementations, dimensions of the interface region 127 for the one or more additional chiplets are consistent across different templates 100, allowing the interface region 127 for coupling the one or more additional chiplets to the first chiplet to have consistent dimensions for multiple templates 100, while one or more dimensions of the power region 125 for the one or more additional chiplets vary across different templates 100.

The dimensions of the second location 120 allow chiplets with different dimensions to be coupled to the substrate within the second location 120. In the example shown by FIG. 1, an additional chiplet having a width that does not exceed the width 130 and a length that does not exceed the length 140 is capable of being coupled to the substrate within the second location 120 and being coupled to power and ground through the connections in the power region 125, while being coupled to the first chiplet through connections in the interface region 127. Hence, the dimensions of second location 120 specified by the template 100 specify a range of dimensions of additional chiplets capable of being to the substrate formed using the template 100. This allows chiplets of varying sizes to be coupled to a substrate designed according to the template 100, enabling the substrate to be reused with varying combinations of the first chiplet and different additional chiplets that have dimensions that do not exceed the dimensions of the second location 120 for coupling the one or more additional chiplets to the substrate. In contrast, conventionally designed substrates are custom designed for a specific combination of chiplets, preventing chiplets other than those for which a conventional substrate was designed from being coupled to the substrate. This custom construction of substrates increases a production time for a semiconductor assembly by introducing time for designing a substrate for a particular combination of chiplets and for fabricating the designed conventional substrate.

In various implementations, the template 100 is generated by an EDA system based on a design specified by a chip designer. A chip designer, for example, can utilize a graphical user interface of the EDA system to specify design parameters for the template 100 including the dimensions of the substrate, dimensions of each region, couplings between connections in the regions, types and density of such connections, and the like. Once such parameters are specified, the EDA system obtains coordinates or other information identifying a position of the first location 110 on a substrate and obtains coordinates or other information identifying a position of the second location 120 on the substrate based on the graphical design (or other inputs provided by a chip designer). The information identifying the position of the first location 110 includes dimensions (e.g., a length and a width) of the first location 110 and at least a reference coordinate for the first location 110 within the substrate in some implementations. Similarly, the information identifying the position of the second location 120 includes dimensions (e.g., a length and a width) of the second location 120 and at least a reference coordinate for the second location 120 within the substrate in some implementations. The EDA system generates a template from the position of the first location 110 and the position of the second location 120 on the substrate and utilizes the template to generate a layout file that includes coordinates on the substrate for the first location 110, coordinates for connections within the first location 110, coordinates on the substrate for the second location 120, and coordinates for connections within the second location 120, and conductive paths coupling connections to each other. The layout file is stored and later used to fabricate a substrate that is the foundation for a semiconductor device designed by a user. In some implementations, the layout file can be loaded into an EDA system by a chip designer and used as foundation upon which a semiconductor device with a variety of chiplets is designed.

The layout file of the template generated by an EDA system includes coordinates on the substrate for the first location 110. The layout file includes coordinates of connections within the interface region 117 coupling the die-to-die interface of the first chiplet to die-to-die interfaces of additional chiplets through one or more traces, metallization layers, redistribution layers (RDL), and like (not shown), and the interface region 127 of the second location 120. Similarly, the layout file includes coordinates for connections for the power interface within the power region 115. The connections of the power interface couple power and ground planes (not shown) to the first chiplet. For example, the connections within the first location 110 are solder bumps, so the layout file identifies positions on the substrate for where solder bumps are placed when the substrate is formed. In various implementations, the coordinates on the substrate for the first location 110 and for the connections within the first location 110 are specified relative to a reference position of the substrate. Other examples of connections include conductive pillars, pins, pads, one or more silicon bridges, one or more silicon interposers, and InFO connections. Hence, the layout file specifies a location on the substrate where the first chiplet is coupled and specifies the positions on the substrate for connections between the substrate and pins or other connectors of the first chiplet.

The layout file of the template 100 also includes coordinates for the second location 120 and for the placement of connections of die-to-die interfaces within the interface region 127 of the second location 120 on the substrate. The layout file also specifies coordinates on the substrate for coupling a die-to-die interface of one or more additional chiplets to the substrate for communication (through one or more traces, RDL layers, metallization layers and the like) with a die-to-die interface of the first chiplet. Similarly, the layout file includes coordinates for placement of connections for the power interface within the power region 125 of the second location on the substrate. The layout file also specifies the coordinates of connections coupling the additional chiplets to power and/or ground planes. For example, the connections within the second location 120 are solder bumps, so the layout file identifies positions on the substrate for where solder bumps are placed when the substrate is formed during fabrication. In various implementations, the coordinates on the substrate for the second location 120 and for the connections within the second location 120 are specified relative to a reference position of the substrate.

In some implementations, the layout file is a GDSII (Graphic Design System stream format) file specifying positions of the first location 110 and the second location 120 relative to a reference location of the substrate and positions for connections, as well as conductive traces coupling different connections through the substrate. In other implementations, the layout file is in a CIF (Caltech Intermediate Form) file, an OASIS (Open Artwork System Interchange Standard) file, EDIF (Electronic Design Interchange Format) file. In other implementations, the layout file is an alternative fabrication specification for the substrate including information specifying positions of the first location 110 and of the second location 120 on the substrate and coordinates within the first location 110 and within the second location 120 for connections to couple a first chiplet and an additional chiplet, respectively, to the substrate.

In various implementations, a substrate is formed according to a layout file generated from a design based on a template. When forming the substrate, connections for the one or more die-to-die interfaces are positioned at coordinates specified by the layout file. Thus, connections are formed on the substrate for coupling to the die-to-die interfaces of the first chiplet and to one or more additional chiplets in coordinates of the interface region 117 within the first location 110 on the substrate for the first chiplet as specified by the layout file. Similarly, connections are formed on the substrate at coordinates within one or more interface regions 127 in the second location 120 on the chiplet for coupling one or more additional chiplets based on the layout file. In various implementations, the layout file specifies a density of the connections or a spacing between the connections. The connections are solder bumps in various implementations, while other types of connections are used in other implementations.

Similarly, connections for coupling power or ground planes to one or more additional chiplets are formed on the substrate in accordance with the layout file. Thus, connections are formed on the substrate in positions within the power region 125 of the second location 120 on the substrate for coupling one or more additional chiplets to the substrate based on coordinates specified by the layout file. In various implementations, the layout file of the template specifies a density of the connections or a spacing between the connections. The connections are solder bumps in various implementations, while other types of connections are used in other implementations. Other example types of connections include conductive pillars, pins, pads, one or more silicon bridges, one or more silicon interposers, and InFO connections. The layout file generated from the design based on the template specifies one or more dimensions, such as a length and a width, of the power region 125 within which coordinates for the connections for coupling power to one or more additional chiplets via the substrate are located, allowing additional chiplets having dimensions that do not exceed the dimensions of the second location 120 on the substrate to be coupled to connections on the substrate for the die-to-die interface with the first chiplet and to be coupled to connections on the substrate for receiving power that are within the second location 120 on the substrate. Similarly, connections on the substrate for coupling to the die-to-die interface of the first chiplet are formed in the first location 110 where the first chiplet is coupled to the substrate, with connections in the interface region 117 of the first location 110 for coupling to the die-do-die interface of the first chiplet and connections in the power region 115 for coupling power to the first chiplet.

In some implementations, the template 100 is included in a set of templates. In some implementations, different sets of templates 100 are maintained for different first chiplets, allowing different sets of templates 100 to account for different dimensions of different first chiplets. One set of templates for a particular I/O controller chiplet may be stored along with one set of templates for a particular memory chiplet for example. Further, in some implementations, different sets of templates 100 are maintained for different first locations 110 where the first chiplet is coupled to the substrate. For example, one set of templates may include a particular I/O controller chiplet in a vertical orientation while another set of templates may include the same particular I/O controller chiplet in a horizontal orientation. Thus, in some implementations, the set of templates 100 is retrieved (for purposes of design) after the first chiplet is selected. From that point, a designer may select one of the set templates based on other criteria, such as the parameters of the second location within the template and other chiplets the designer intends to include in the design. In other implementations, the set of templates 100 is retrieved not based on the first chiplet, but on other criteria, such as substrate dimensions, a number of chiplets to couple to the substrate, one or more specific types of chiplets to couple to the substrate, or other suitable criteria.

In various implementations, different templates 100 of a set have different dimensions for a second location 120 on the substrate, with the second location 120 specifying a location where one or more additional chiplets are capable of being coupled to the substrate. In some implementations, each template 100 of the set has one or more different dimensions for the second location 120 than other templates 100 of the set. For example, a first template of the set has a dimension for the second location 120 that differs from the corresponding dimension for the second location 120 specified by a second template of the set.

Further, in some implementations, different templates of a set have one dimension of the second location 120 that is common across the templates of the set, while another dimension of the second location 120 differs across different templates of the set. For example, each template of the set has a different length of the second location 120, while having a common width of the second location 120. In implementations where a set of templates are maintained, and one of the templates 100 is selected via the EDA system, which generates a layout file from the selected template 100 to fabricate a substrate. The templates may be stored in a repository, a database, at an online storage location, in a file system, or included as a library for the EDA system software in different implementations. A selection of one of the templates can be made by the EDA system based on user's selection of the template, based on a history of template access (e.g., reloading the last used template), based on receipt of an identification of a particular chiplet from a user, based on a user specification of one and or more design parameters, and so on.

For further illustration, FIG. 2, FIG. 3, FIG. 4, and FIG. 5 depict different semiconductor assembly designs based on the same template. FIG. 2 shows a semiconductor design that is based on template 100, which was further described above in conjunction with FIG. 1. The layout in FIG. 2 depicts a first chiplet 205 coupled to connections in the interface region 117 of the first location 110 and coupled to connections in the power region 115 of the first location 110. The connections in the interface region 117 of the first location couple a die-to-die interface of the first chiplet 205 to the substrate, while the connections in the power region 115 couple the first chiplet to power and ground planes through a substrate 200 fabricated based on template 100.

The layout in FIG. 2 also shows two additional chiplets: a second chiplet 210A and a third chiplet 210B. The second chiplet 210A is coupled to a subset of the connections within the second location 120 and the third chiplet 210B is coupled to a different subset of the connections. The second chiplet 210A includes a die-to-die interface that is coupled to connections on the substrate in the interface region 127, allowing the second chiplet 210A to communicate with the first chiplet 205 via connections between the interface region 127 and the interface region 117. The second chiplet 210A is also coupled to power and ground planes through connections in the power region 125. Similarly, the third chiplet 210B includes a die-to-die interface that is coupled to connections in the interface region 127 allowing communication with the first chiplet 205 (and in some implementations the second chiplet 210A) via connections between the interface region 127 and interface region 117. The third chiplet 210B is also coupled to power and ground planes through connections in the power region 125. As shown in FIG. 2, some connections in the power region 125 of the second location 120 are not coupled to any of the chiplets. That is, chiplets with dimensions less than corresponding dimensions of the second location 120 are to be coupled to the substrate 200 within the second location 120.

As shown in FIG. 2, a length 215 of the second chiplet 210A and a length 215 of the third chiplet 210B is less than a length 140 of the second location 120. Similarly, the width 220 of the second chiplet 210A and the width of the third chiplet 210B is less than the width 130 of the second location 120. In various implementations, a combined dimension of each of the additional chiplets 210A, 210B does not exceed a corresponding dimension of the second location 120. For example, a sum of the width 220 of the second chiplet 210A and the width 220 of the third chiplet 210A does not exceed the width 130 of the second location 120, as shown in FIG. 2.

Figure 3:
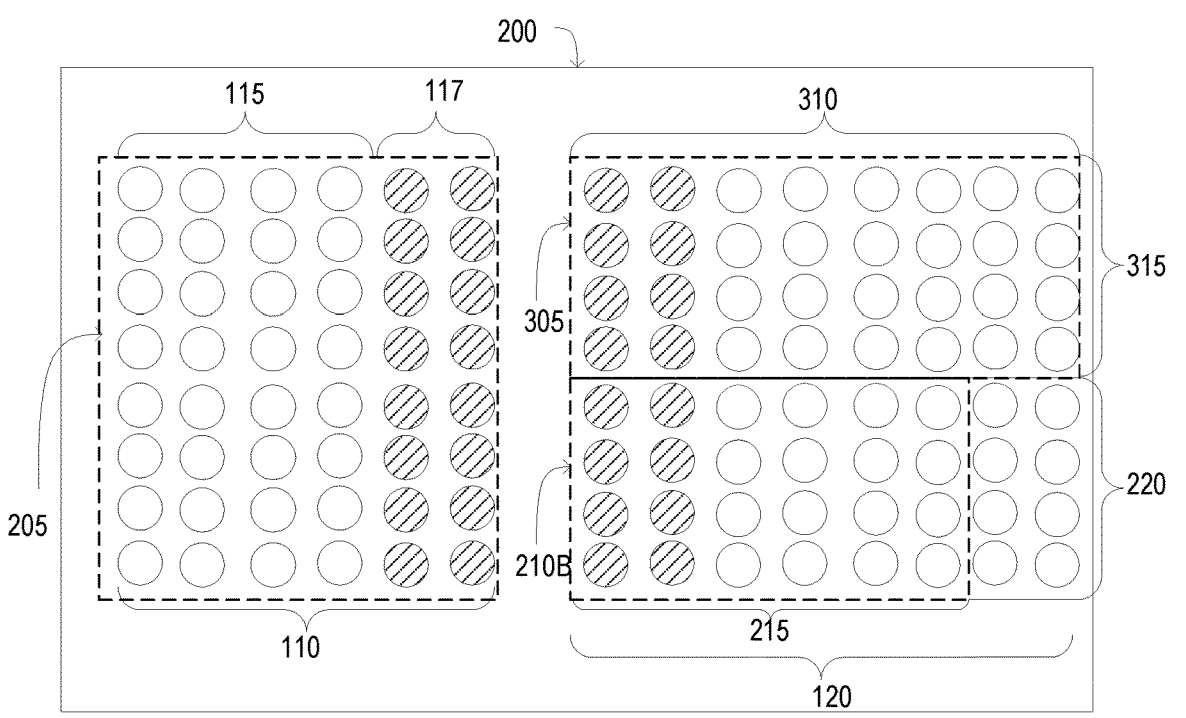
FIG. 3 depicts another design of a semiconductor assembly based on the same template of FIG. 2.

For further illustration, FIG. 3 shows another example semiconductor design having a layout based on the template 100 for the substrate 200. The semiconductor assembly shown in FIG. 3, like that in FIG. 2, includes the first chiplet 205 coupled to connections in the interface region 117 to connections in the power region 115. The example semiconductor assembly shown in FIG. 3 includes the chiplet 210B coupled to a subset of the connections within the second location 120 on the substrate 200 and an alternative chiplet 305 coupled to another subset of the connections within the second location 120. The chiplet 305 is referred to as 'alternative' with respect to the chiplet 210A of FIG. 2. The alternative chiplet 305 includes a die-to-die interface that is coupled to connections in the interface region 127, allowing the alternative chiplet 305 to communicate with the first chiplet 205 via connections in the interface region 127.

The alternative chiplet 305 has a length 310 equaling the length of the second location 120 on the substrate 200 for coupling the one or more additional chiplets and a width 315 that is less than the width 130 of the second location 120. As further described above in conjunction with FIG. 2, the chiplet 210B has a width 220 that is less than the width 130 of the second location 120 on the substrate 200 for coupling the one or more additional chiplets and a length 215 that is less than the length 140 of the of the second location 120 on the substrate 200 for coupling the one or more additional chiplets. Hence, a set of the connections in the second location 120 are not coupled to the alternative additional chiplet 305 or to the chiplet 210B. As shown in FIGS. 2 and 3, the dimensions of the second location 120 on the substrate 200 for coupling the one or more additional chiplets specified by the template allow additional chiplets having different dimensions to be coupled to the substrate within the second location 120 on the substrate 200 for coupling the one or more additional chiplets, increasing an ability to use the substrate 200 for different configurations or designs for a semiconductor assembly.

Figure 4:
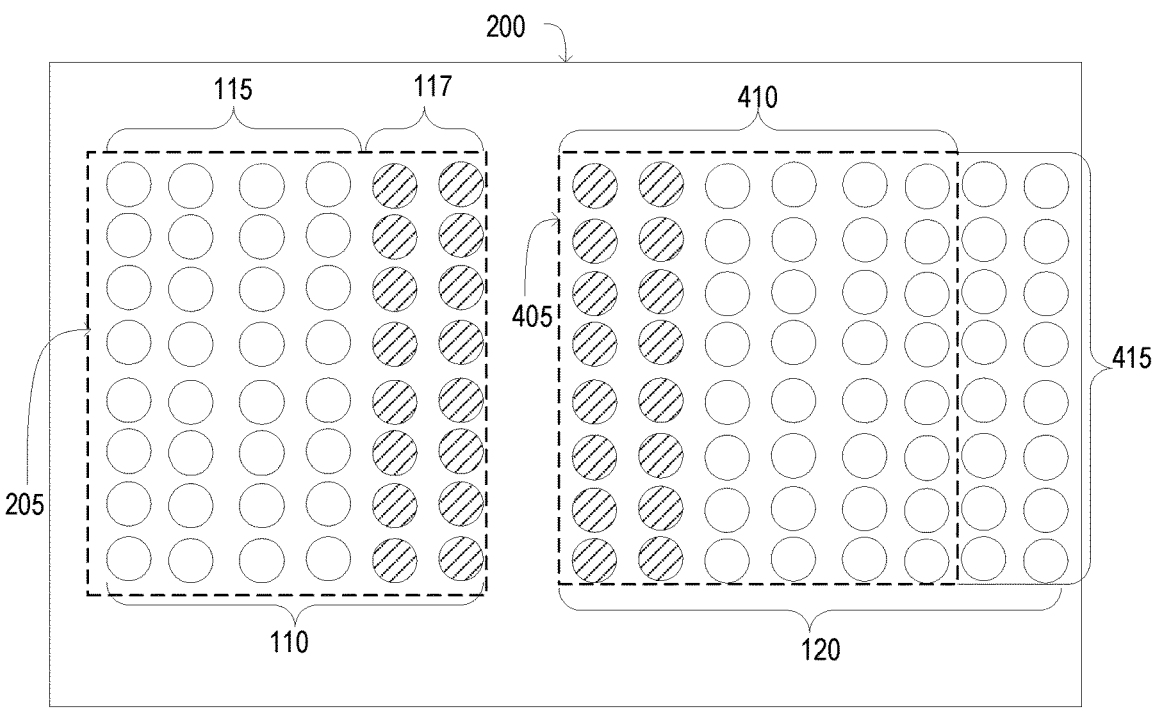
FIG. 4 depicts yet a different design of a semiconductor assembly based on the same template of FIG. 2.

For further illustration, FIG. 4 shows a semiconductor assembly design based on the same template 100 as those in FIGS. 2 and 3. The semiconductor assembly shown in FIG. 4 includes the first chiplet 205 coupled to connections in the interface region 117 of the first location 110 and to connections in the power region 115 of the first location 110. The connections in the interface region 117 of the first location couple a die-to-die interface of the first chiplet 205 to the substrate, while the connections in the power region 115 couple the first chiplet to power and ground through the substrate 200.

In the example semiconductor assembly shown by FIG. 4, a second chiplet 405 is coupled to a subset of the connections within the second location 120 on the substrate 200. The second chiplet 405 includes a die-to-die interface that is coupled to connections in the interface region 127. The connections in the interface region 127 are coupled through traces, metallization layers, RDL and the like to the connections in interface region 117. As such, the second chiplet 405 is coupled to the first chiplet 205. The second chiplet 405 is also coupled to connections in the power region 125, which couple the second chiplet 405 to power and ground planes. The second chiplet 405 has a length 410 that is less than the length 140 of the second location 120 on the substrate 200 and a width 415 that equals the width 130 of the second location 120. As such, a set of the connections within the second location 120 on the substrate 200 are not coupled to the second chiplet 405 (or to any chiplet). That is, when fabricated, some connections in the second location will be uncoupled to any chiplet and, in some examples, will be exposed. In the example shown by FIG. 4, the set of connections within the second location 120 that are not coupled to the second chiplet 405 are included in the power region 125, but in some implementations, connections in the interface region 127 of the second location 120 are unconnected to any chiplet.

Figure 5:
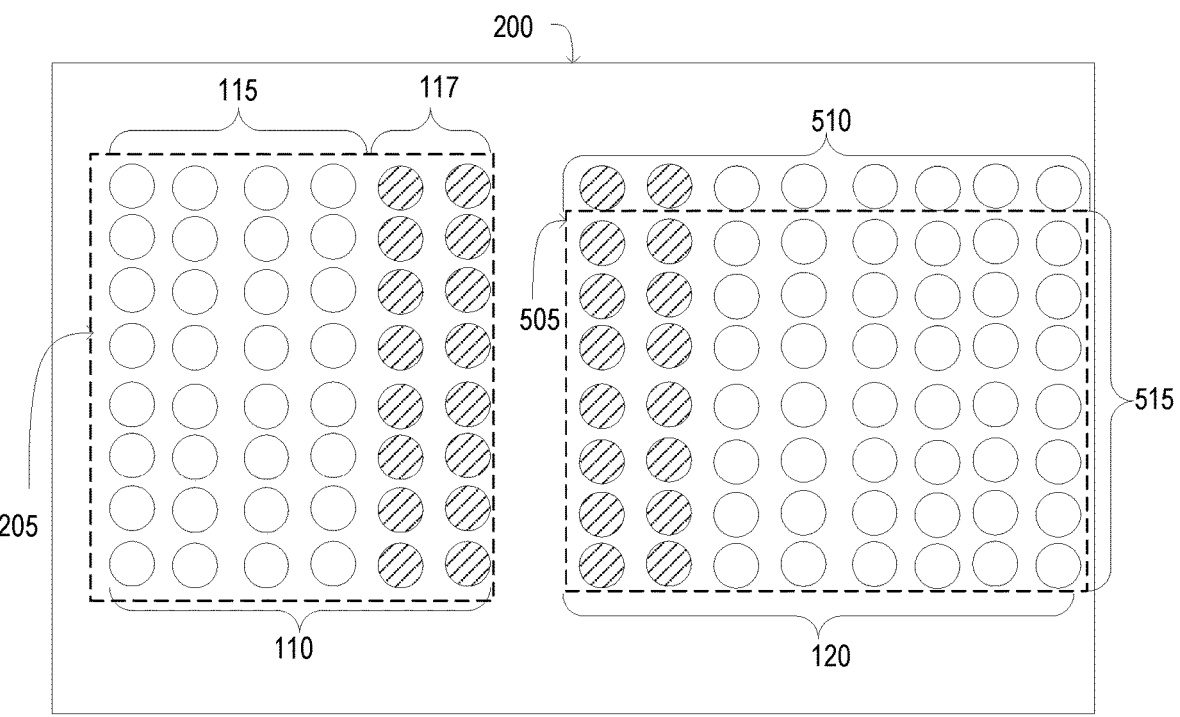
FIG. 5 depicts another variation of a design of a semiconductor assembly based on the same template of FIG. 2.

FIG. 5 shows also depicts a layout of a semiconductor assembly based on the same template 100 as FIGS. 2-4. Additionally, the first chiplet 305 in the example assembly of FIG. 5 is the same as that of FIG. 4 and is connected to the substrate 200 in a similar fashion. A second chiplet 505 is coupled to a subset of the connections within the second location 120 on the substrate 200. The second chiplet 505 has a length 510 equal to the length 140 of the second location 120 and a width 515 that is less than the width 130 of the second location 120. As such, a set of the connections within the second location 120 are not coupled to any chiplet. More specifically, the set of connections that are not coupled to any chiplet include connections both in the power region 125 and in the interface region 127 of the second location 120.

As shown in FIGS. 2-5, any number of chiplets having a range of dimensions are capable of being coupled to the second location 120 of a substrate manufactured from the template 100. This allows the template 100 to be reused for different combinations of a first chiplet in the first location 110 and one or more second chiplets coupled to the second location 120. Such flexibility in coupling second chiplets having different dimensions to the second location 120 reduces fabrication time for a semiconductor assembly by allowing reuse of a substrate across different combinations of chiplets. Further, the second location 120 of the substrate increases flexibility of semiconductor assembly design by allowing different second chiplets having different dimensions within the second location 120 to be coupled to the substrate.

Figure 6:
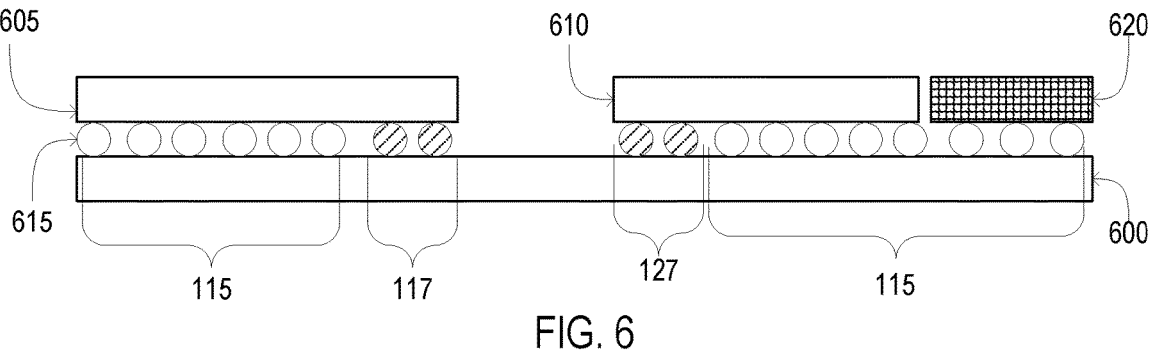
FIG. 6 shows a cross-sectional diagram of a semiconductor assembly designed according to a template in accordance with implementations of the present disclosure.

For further explanation, FIG. 6 shows a cross-sectional diagram of a semiconductor assembly designed according to a template in accordance with implementations of the present disclosure. The example semiconductor assembly of FIG. 6 includes a first chiplet 605 and a second chiplet 610 coupled to a substrate 600 designed using a template 100. The first chiplet 605 in the semiconductor assembly shown in FIG. 6 is coupled to connections 615 in the power region 115 of the first location 110 and to connections 615 in the interface region 117 of the first location 110, as further described above in conjunction with FIGS. 1-5. Similarly, the second chiplet 610 is coupled to connections 615 in the power region 125 of the second location 120 and to connections 615 in the interface region 127 of the second location 120, as further described above in conjunction with FIGS. 1-5.

In the example shown by FIG. 6, the second chiplet 610 is coupled to a subset of the connections 615 in the second location 120, leaving an additional subset of the connections 615 in the second location 120 uncoupled to the second chiplet 610 (or to any chiplet). In some implementations, the additional subset of the connections 615 remain exposed in the semiconductor assembly. In other implementations, such as the implementation shown in FIG. 6, the additional subset of the connections 615 are coupled to a layer 620 of material. In some examples, the material is silicon or another dielectric material. In various implementations, the layer 620 of material does not include active components. Coupling the layer 620 of material to the connections 615 in the second location 120 that are not coupled to the second chiplet 610 allows the semiconductor assembly to have a more uniform distribution of weight and height, improving balance of the semiconductor assembly.

Figure 7:
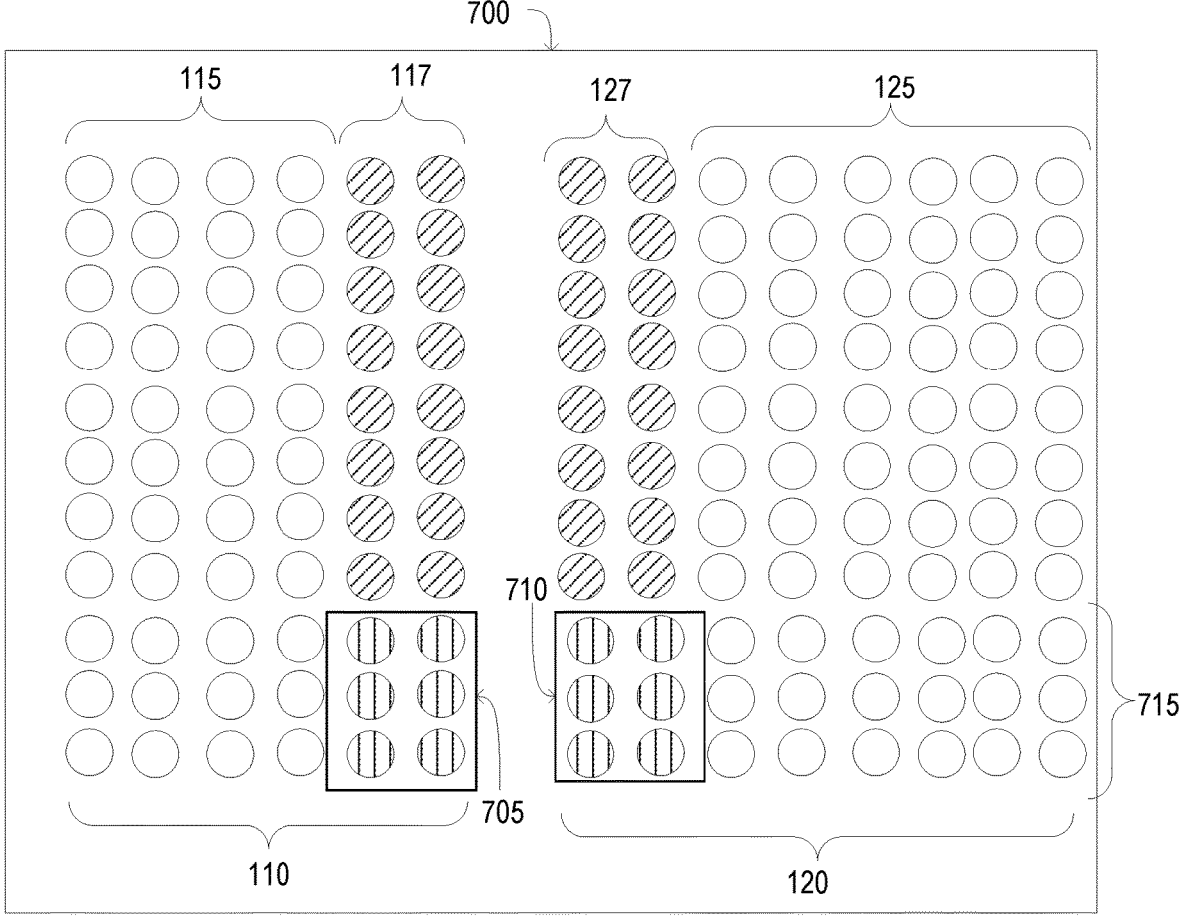
FIG. 7 shows a graphical representation of an example template for a substrate of a semiconductor assembly according to implementations of the present disclosure.

FIG. 7 shows a graphical representation of an example template 700 for a substrate of a semiconductor assembly. The template 700 includes a first location 110 where a first chiplet (not shown here) is coupled to the substrate. Readers will also recognize that in some implementations, a template may specify multiple different chiplets in the first location 110.

The template 700 differs from the templates 100 described above in that the interface region 117 of the template 700 includes a specialized interface region 705, with connections on the substrate located in the specialized interface region 705 configured to exchange signals between the first chiplet and one or more second chiplets in the second location 120 using a second die-to-die interface that differs from the die-to-die interface supported by other connections in the interface region 117. Said another way, the 'specialized interface region' includes connections for a chiplet to a 'side-band' coupling between chiplets in the first and second location, and the side-band coupling is in addition to another die-to-die coupling between the two locations. For example, the second die-to-die interface may be a die-to-die interface provided by a manufacturer of the first chiplet providing a particular communication format or a communication speed for communicating with the second chiplet. In some implementations, a distance between connections on the substrate or a pitch of connections on the substrate within the specialized interface region 705 differs from a distance between connections or a pitch of connections outside of the specialized interface region 705. In this way, the specialized interface region 705 allows the template 700 to specify locations on the substrate for using different die-to-die interfaces for second chiplets in the second location to communicate with the first chiplet in the first location. While FIG. 7 shows the template 700 specifying locations for a die-to-die interface and for a specialized die-to-die interface, in other implementations, a template 700 includes any number of different specialized interface regions 705 within the interface region 117 to identify locations on a substrate for connections that use any number of different types of die-to-die interfaces.

Similarly, the template 700 includes a specialized interface region 710 within an interface region 127 of the second location 120. Connections on the substrate in specialized interface region 710 are coupled to connections on the substrate in the specialized interface region 705 to exchange signals between a first chiplet and a second chiplet using the second die-to-die interface. In this way, the specialized interface region 710 allows the template 700 to specify locations on the substrate for using a die-to-die interface that differs from die-to-die interfaces supported by connections in other areas of the interface region 127 to communicate with chiplets in the first location 110. In the example of FIG. 7, a specialized interface region 715 of the second location 120 includes connections for coupling a second chiplet to the substrate so the second chiplet receives power via the substrate. The specialized interface region 715 may include connections of different number, density, type, or pitch and/or be coupled to power and ground planes of different characteristics than those of other connections in the power region 125. That is, the power region 125 of a template may include a variety of different power and ground connections. While FIG. 7 shows the template 700 specifying locations for a die-to-die interface and for a second die-to-die interface, in other implementations, a template 700 includes any number of specialized interface regions 710 within the interface region 127 to identify locations on a substrate for connections that use any number of different types of die-to-die interfaces.

In some implementations, the die-to-die interface supported by connections in the interface region 117 outside of the specialized interface region 710 and outside of the specialized interface region 715 is based on a standard. The standard specifies functionality provided by the die-to-die interface. Connections in the interface region 117 outside of the specialized interface region 710 and outside of the specialized interface region 715 provide physical connections for the first chiplet and the second chiplet to communicate with each other based on the standard. Example standards for configuring the die-to-die interface include Universal Chiplet Interconnect Express (UCIe), Open Domain-Specific Architecture (ODSA), Common Hardware for Interfaces, Processors, and Systems (CHIPS) Alliance, or other standards defining communication between chiplets. The second die-to-die interface supported by connections in the specialized interface region 710 and in the specialized interface region 715 provides different functionality than the functionality provided by the standard. For example, the second die-to-die interface has one or more different communication protocols than the die-to-die interface based on the standard or provides additional functionality than the die-to-die interface based on the standard. In some implementations, the second die-to-die interface is determined by a manufacturer of the first chiplet. Hence, the template 700 shown in FIG. 7 allows a second chiplet using the die-to-die interface provided by the standard to be coupled to a substrate to communicate with the first chiplet. Additionally or alternatively, the template allows a second chiplet using the second die-to-die interface to be coupled to the substrate to communicate with the first chiplet. This allows a substrate formed based on the template 700 to support different interfaces for communication between the first chiplet and one or more second chiplets.

Figure 8:
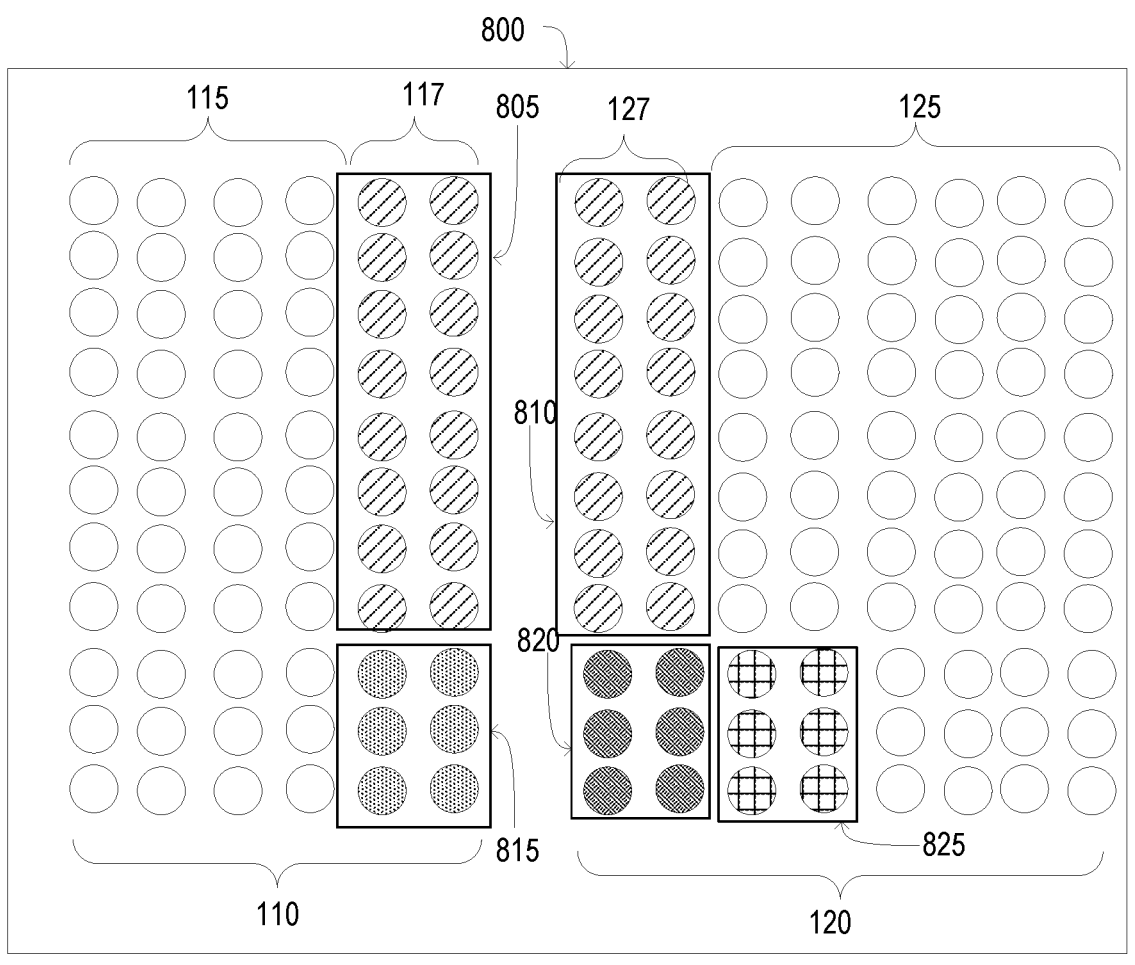
FIG. 8 shows an overhead graphical representation of another example template for a substrate of a semiconductor assembly according to implementations of the present disclosure.

For further explanation, FIG. 8 shows a graphical overhead representation of another example template 800 for a substrate of a semiconductor assembly. The template 800 includes a first location 110 where a first chiplet (not shown here) is coupled to the substrate. Readers will also recognize that in some implementations, a template may specify multiple different chiplets in the first location 110.

The template 800 depicted in FIG. 8 differs from the templates 100 described above in that the interface region 117 of the template 800 includes a standardized interface region 805 and a sideband region 815. The standardized interface region 805 includes connections for use with a die-to-die interface for exchanging data between a first chiplet (not shown) in the first location 110 and a second chiplet (not shown) in the second location 120. Connections in the standardized interface region 805 of the first location 110 are coupled to connections in a standardized interface region 810 of the second location 120. As further described below in conjunction with FIG. 11, a connection in the standardized interface region 805 of the first location 110 is coupled to a connection in the standardized interface region 810 of the second location 120 through one or more conductive pathways included in a substrate formed based on the template 800.

In various implementations, the die-to-die interface between the first chiplet and a second chiplet supports a specific set of communication functions or protocols for exchanging data between a first chiplet and a second chiplet. For example, the die-to-die interface is configured based on a standard, with the connections in the standardized interface region 805 of the first location 110 and the standardized interface region 810 of the second location 120 providing physical connections for the first chiplet and the second chiplet to communicate with each other based on the standard. Example standards for configuring the die-to-die interface include UCIe, ODSA, CHIPS Alliance, or other standards defining communication between chiplets. In other examples, a manufacturer of the first chiplet defines communication between the first chiplet and second chiplets through the die-to-die interface corresponding to the standardized interface region 805 of the first location 110 and to the standardized interface region 810 of the second location 120. Thus, the template 800 specifies locations on a substrate where connections are located for the first chiplet and the second chiplet to communicate using a standardized interface.

In some implementations, the first chiplet and the second chiplet communicate through a sideband interface that complements the die-to-die interface between the first chiplet and the second chiplet. In such implementations, the die-to-die interface specifics communication between the first chiplet and the second chiplet, while the sideband interface provides another interface between the first chiplet and the second chiplet. Using the sideband interface, additional communication functionality beyond what is provided by the die-to-die interface is provided between the first chiplet and the second chiplet. Example communication functionality provided by the sideband interface includes additional security, debugging capabilities, higher bandwidth input-output connections relative to the die-to-die interface, lower latency input-output connections relative to the die-to-die interface, and other functionality. Hence, the sideband interface augments a die-to-die interface between the first chiplet and the second chiplet by providing functionality in addition to the functionality provided by the die-to-die interface. In various implementations, functionality provided by the sideband interface is based on a combination of the first chiplet and the second chiplet, allowing different combinations of first chiplet and second chiplet to have different functionality provided by a sideband interface. In some implementations, the template 800 is stored in association with a combination of a first chiplet and a second chiplet to simplify subsequent retrieval of the template 800 to form a substrate supporting the die-to-die interface and the sideband interface between the first chiplet and the second chiplet.

To implement the sideband interface, the template 800 shown in FIG. 8 includes a sideband region 815 in the first location and a second sideband region 820 in the second location 120. Connections in the sideband region 815 of the first location 110 are coupled to connections in the second sideband region 820 of the second location 120. This allows a substrate formed from the template 800 to augment communication between a first chiplet and a second chiplet through a standardized interface with a sideband interface providing additional functionality that is in a location specified by the sideband region 815. As further described below in conjunction with FIG. 11, a connection in the sideband region 815 of the first location 110 is coupled to a connection in the sideband region 820 of the second location 120 through one or more conductive pathways included in a substrate fabricated based on the template 800, as further described below in conjunction with FIG. 11. In some implementations, a distance between connections on the substrate within the sideband region 815 differs from a distance between connections on the substrate within the standardized interface region 805. Similarly, in various implementations, a distance between connections on the substrate within the second sideband region 820 differs from a distance between connections on the substrate within the standardized interface region 810. In other implementations a distance between connections is consistent between the standardized interface region 805 and the sideband region 815, as well as between the standardized interface region 810 and the second sideband region 820.

Additionally, the template 800 includes an external connection region 825 in the second location 120. The external connection region 825 is a location on a substrate that includes connections coupling the second chiplet to one or more components external to an integrated circuit device including a substrate formed from the template 800. The external connection region 825 specifies locations on the substrate for connections that are directly connected to outside connections. In various implementations, the connections are on a surface of the substrate that is nearest to the second chiplet and the outside connections are on an opposite surface of the substrate. Examples of the outside connection include a pin, a solder bump, or other conductive connection. A connection pathway through the substrate couples a connection in the external connection region 825 to an outside connection. The connection pathway is a conductive material coupled to both a connection and to an external connection. In some implementations, the conductive pathway is coupled to a connection at a first end and is coupled to an outside connection at a second end. The template 800 specifies locations on the substrate for the connections in the external connection region 825, for the outside connections, and information for routing one or more connection pathways from a connection in the external connection region 825 to an outside connection.

Thus, the external connection region 825 allows the template 800 to specify locations on the substrate for the second chiplet to directly connect to other components external to the substrate. Example components coupled to the second chiplet via connections in the external connection region 825 a display, a network adapter, a Universal Serial Bus (USB) device, a Serial Advanced Technology Attachment (SATA) device, a strap for coupling the second chiplet to a test interface or other device, while other components are capable or being coupled to the chiplet through a connection in the external connection region 825 in various implementations. Selection of the template 800 for forming a substrate simplifies placement of connections between the second chiplet and one or more external components using the external connection region 825. Inclusion of the external connection region 825 in the template 800 allows a substrate manufactured from the template 800 to simplify one or more connections between second chiplets and other external components through one or more connections included in the external connection region 825.

While the template 800 shown in FIG. 8 includes the sideband region 815, the sideband region 820, and the external connection region 825, a template may include information for supporting one of a sideband interface or external connections for the second chiplet. For example, a different template 800 includes the sideband region 815 and the second sideband region 820, but does not include the external connection region 825. An alternative template includes the external connection region 825 but does not include the sideband region 815 or the second sideband region 820. Hence, different templates provide different functionality for communication between a second chiplet and the first chiplet or between the second chiplet and external components.

While FIG. 8 shows an example template 800 where the sideband region 815 is included in the interface region 117 of the first location 110, in other implementations, the sideband region 815 is in a different position within the first location 110 than the interface region 117. Similarly, the second sideband region 820 of the second location 120 is in a position within the second location 120 that is outside of the interface region 127 of the second location 120 in some implementations. While FIG. 8 shows the external connection region 825 of the second location 120 as physically contiguous to the interface region 127 of the second location, in other implementations, the external connection region 825 is within the second location 120 but is separated from the interface region 127 of the second location. Hence, in different implementations, the template 800 is capable of identifying different positions for the sideband region 815 within the first location 110 and of identifying different positions for the second sideband region 820 and for the external connection region 825 within the second location 120.

Forming a substrate based on template 800 allows different combinations of first chiplet and second chiplet to be coupled to the substrate. A second chiplet communicating with the first chiplet using the die-to-die interface and the sideband interface is coupled to connections in in the interface region 127 of the second location 120 and to connections in the second sideband region 820 of the second location 120. When the second chiplet is also configured to be coupled to one or more external components, the second chiplet is also coupled to connections in the external connection region 825 in the second location. However, if the second chiplet is not configured to communicate with the first chiplet using the sideband interface, the second chiplet is coupled to connections in the second sideband region 820 of the second location 120 but internally connects the connections in the second sideband region 820 to power or to ground in various implementations. Similarly, when a second chiplet that is not configured to be coupled to external components is coupled to connections in the external connection region 825, the second chiplet internally connects connections in the external connection region 825 to power or to ground. This allows second chiplets that do not use the sideband interface or that are not configured to be coupled to external components to be coupled to a substrate generated from the template 800, allowing increased reuse of the template 800 for various combinations of first chiplets and second chiplets.

Figure 9:
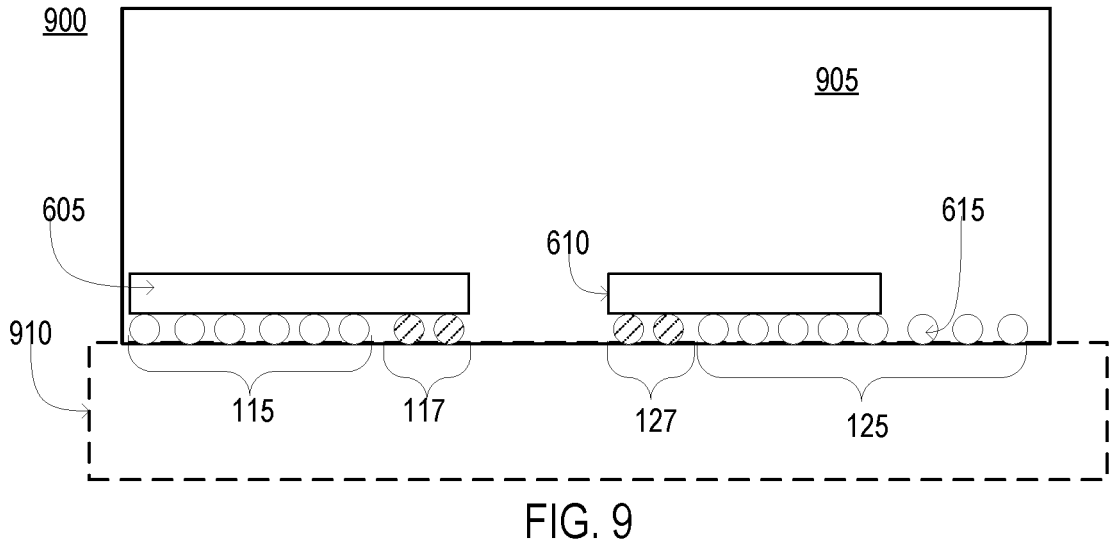
FIG. 9 is a cross-sectional diagram of an example integrated circuit device including a substrate formed based on a template selected from a set of templates according to some implementations.
Figure 10:
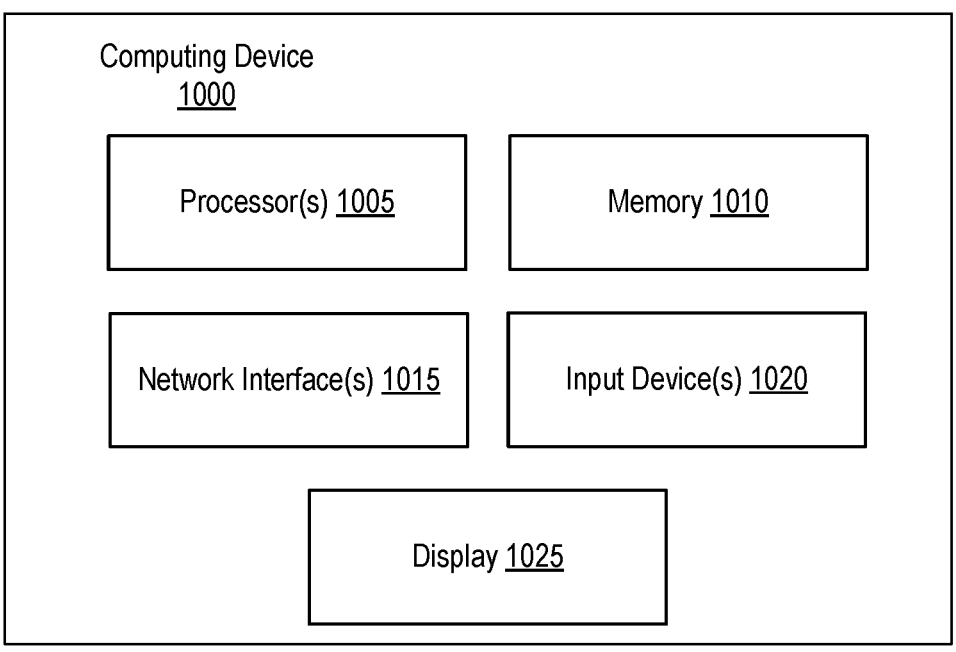
FIG. 10 is an example computing device according to some implementations.

FIG. 9 is a cross-sectional diagram of an example integrated circuit device 900 including a semiconductor assembly formed from a design based on a reusable template in accordance with implementations of the present disclosure. The example integrated circuit device 900 can be implemented in a variety of computing devices, including mobile devices, personal computers, peripheral hardware components, gaming devices, set-top boxes, smart phones, and the like (as shown in FIG. 10). The example integrated circuit device 900 of FIG. 9 includes a semiconductor assembly 905 including a first chiplet 605 and a second chiplet 610. The first chiplet 605 and the second chiplet 610 are coupled to a substrate 910 fabricated based on a template 100 through one or more connections 615. In various implementations, the connections 615 are solder balls placed in coordinates on the substrate 910 specified by a layout file generated from a specified template 100.

The substrate 910 is a portion of material that mechanically supports coupled components such as the semiconductor assembly 905. In some implementations, the substrate 910 also electrically couples various components mounted to the substrate 910 via conductive traces, tracks, pads, and the like. The substrate 910 electrically couples a component of the semiconductor assembly 905 to one or more other components via a connective trace and a connection, such as a solder joint formed from a solder ball coupled to a conductive pad. In other implementations, the substrate 910 uses different types of connections to couple one or more components to the semiconductor assembly 905. Examples of other connections include through holes, sockets, and pins. For example, the substrate 910 electrically couples the first chiplet 605 and the second chiplet 610 through connections 615 and traces in the substrate 910. In various implementations, different connections 615 are positioned on the substrate 910 at coordinates specified by a layout file generated from the selected template. In the example shown by FIG. 9, connections 615 in a power region 115 on the substrate 910 couple the first chiplet 605 to power or to ground, while connections in the interface region 117 are coupled to connections in the interface region 127 via traces and the like in the substrate 910. In various implementations, the substrate 910 is an organic package substrate. In other implementations, the substrate 910 is a silicon interposer including connections between the first chiplet 605 and one or more second chiplets 610. In other examples, the substrate 910 is a glass interposer, an organic interposer, or other structure including connectors for coupling to chiplets and conductive pathways between different connectors.

In some implementations, the connections 615 coupling the semiconductor assembly 905 to the substrate 910 are included in a socket (not shown), where the semiconductor assembly 905 is soldered to or otherwise mounted in the socket. In other implementations, as shown in FIG. 9, the connections 615 couple the semiconductor assembly 905 to the substrate 910 via a direct solder connection or other connection as can be appreciated. In some implementations, the semiconductor assembly 905 is coupled to the substrate 910 using a land grid array (LGA), pin grid array (PGA), or other packaging technology as can be appreciated.

In an example, the semiconductor assembly 905 includes one or more processors 1005 of a computing device 1000 as shown in FIG. 10. The computing device 1000 is implemented, for example, as a desktop computer, a laptop computer, a server, a game console, a smart phone, a tablet, and the like. In addition to one or more processors 1005, the computing device 1000 includes memory 1010. The memory 1010 includes Random Access Memory (RAM) or other volatile memory. The memory 1010 also includes non-volatile memory such as disk storage, solid state storage, and the like.

In some implementations, the computing device 1000 also includes one or more network interfaces 1015. In some implementations, the network interfaces 1015 include a wired network interface 1015 such as Ethernet or another wired network connection as can be appreciated. In some implementations, the network interfaces 1015 include wireless network interfaces 1015 such as Wi-Fi, BLUETOOTH®, cellular, or other wireless network interfaces 1015 as can be appreciated. In some implementations, the computing device 1000 includes one or more input devices 1020 that accept user input. Example input devices 1020 include keyboards, touchpads, touch screen interfaces, and the like. One skilled in the art will appreciate that, in some implementations, the input devices 1020 include peripheral devices such as external keyboards, mouses, and the like.

In some implementations, the computing device 1000 includes a display 1025. In some implementations, the display 1025 includes an external display connected via a video or display port. In some implementations, the display 1025 is housed within a housing of the computing device 1000. For example, the display 1025 includes a screen of a tablet, laptop, smartphone, or other mobile device. In implementations where the display 1025 includes a touch screen, the display 1025 also serves as an input device 1020.

Figure 11:
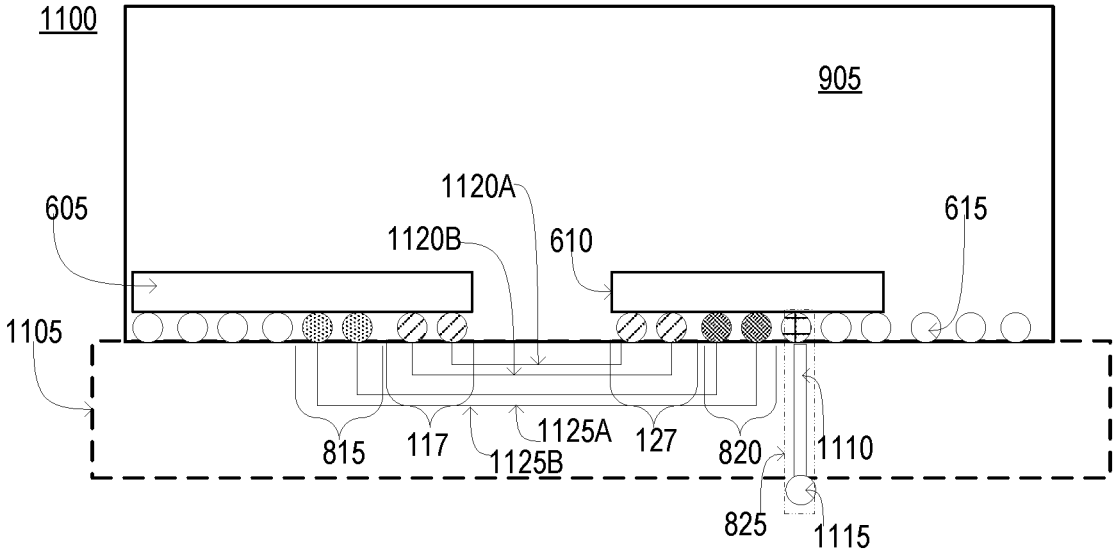
FIG. 11 is a cross-sectional diagram of an example integrated circuit device including a substrate formed based on a reusable template specifying one or more external connections for a second chiplet in accordance with some implementations.

FIG. 11 is a cross-sectional diagram of an example integrated circuit device 1100 including a substrate formed based on a reusable template specifying one or more external connections for a second chiplet in accordance with implementations of the present disclosure. The example integrated circuit device 1100 can be implemented in a variety of computing devices, including mobile devices, personal computers, peripheral hardware components, gaming devices, set-top boxes, smart phones, and the like (as further described above in conjunction with FIG. 10). The example integrated circuit device 1100 of FIG. 11 includes a semiconductor assembly 905 including a first chiplet 605 and a second chiplet 610. The first chiplet 605 and the second chiplet 610 are coupled to a substrate 1105 through one or more connections 615. In various implementations, the connections 615 are solder balls placed in coordinates on the substrate 1105 specified by a layout file generated from template 100.

In the example shown by FIG. 11, the substrate 1105 was formed from a reusable template specifying coordinates for an external connection region 825 for the second chiplet 610. For example, the substrate 1105 is fabricated from the reusable template 800 further described above in conjunction with FIG. 8. As further described above in conjunction with FIG. 8, the external connection region 825 includes one or more connections 615 is configured to couple the second chiplet 610 to one or more components external to the integrated circuit device 1100. For example, the external connection region 825 provides an input-output connection between the second chiplet 610 and a component external to the integrated circuit device 1100. Example components external to the integrated circuit device 1100 include a display, a network adapter, a Universal Serial Bus (USB) device, a Serial Advanced Technology Attachment (SATA) device, a strap for coupling the second chiplet 610 to a test interface or other device, while other components are capable or being coupled to the chiplet through a connection in the external connection region 825 in various implementations. The substrate 1105 includes a connection pathway 1110 that is coupled to a connection 615 in the external connection region 825 and to an outside connection 1115. The connection pathway 1110 is a conductive material coupled at one end to the connection 615 in external connection region 825 and coupled at an opposite end to the outside connection 1115. The outside connection 1115 is external to the substrate 1105 and is configured to be coupled to a component external to the integrated circuit device 1100. Examples of the outside connection include a pin, a solder bump, or other conductive connection.

Further, the integrated circuit device 1100 shown in FIG. 11 was formed from a layout file based on a reusable template that includes an interface region 117 in the first location 110, an interface region in the second location 120, a sideband region 815 in the first location, and a second sideband region 820 in the second location 120. As further described above in conjunction with FIGS. 1-6, a connection 615 in the interface region 117 in the first location 110 is coupled to a connection 615 in the interface region 127 in the second location 120. These connections provide a die-to-die interface for exchanging data between the first chiplet 605 and the second chiplet 610. For purposes of illustration, FIG. 11 shows conductive pathways 1120A. 1120B in the substrate 1105 coupling a connection 615 in the interface region 117 in the first location 110 is coupled to a connection 615 in the interface region 127 in the second location 120. A layout file generated from the reusable template includes instructions for routing the conductive pathways 1120A, 1120B through the substrate 1105.

As further described above in conjunction with FIG. 8, to provide additional functionality for communications between the first chiplet 605 and the second chiplet 610, the substrate includes connections 615 in the sideband region 815 in the first location 110 and connections in the second sideband region 820 in the second location 120. A connection 615 in the sideband region 815 in the first location 110 is coupled to a connection 615 in the second sideband region 820 in the second location 120 through the substrate 1105. FIG. 11 shows a conductive pathway 1125A coupling a connection 615 in the sideband region 815 in the first location 110 to a connection 615 in the sideband region 820 in the second location 120 through the substrate 1105. Similarly, FIG. 11 shows a conductive pathway 1125B coupling a second connection 615 in the sideband region 815 in the first location 110 to a second connection 615 in the second sideband region 820 in the second location 120 through the substrate 1105. The layout file generated from the reusable template includes instructions for routing the conductive pathways 1125A, 1125B through the substrate 1105.

Hence, the substrate 1105 generated from the reusable template for the integrated circuit device 1100 shown in FIG. 11 includes connections 615 for a die-to-die interface and for a sideband communication channel between the first chiplet 605 and the second chiplet 610. Additionally, the substrate 1105 enables coupling of the second chiplet 610 to one or more components external to the integrated circuit device 1100 through the connection in the external connection region 825, the connection pathway 1110, and the outside connection 1115. As shown in FIGS. 9 and 11, different reusable templates allow for different placements of connections 615 on a substrate and allows inclusion of selection of different types of connections between the first chiplet 605, the second chiplet 610, and between other components in a substrate.

Figure 12:
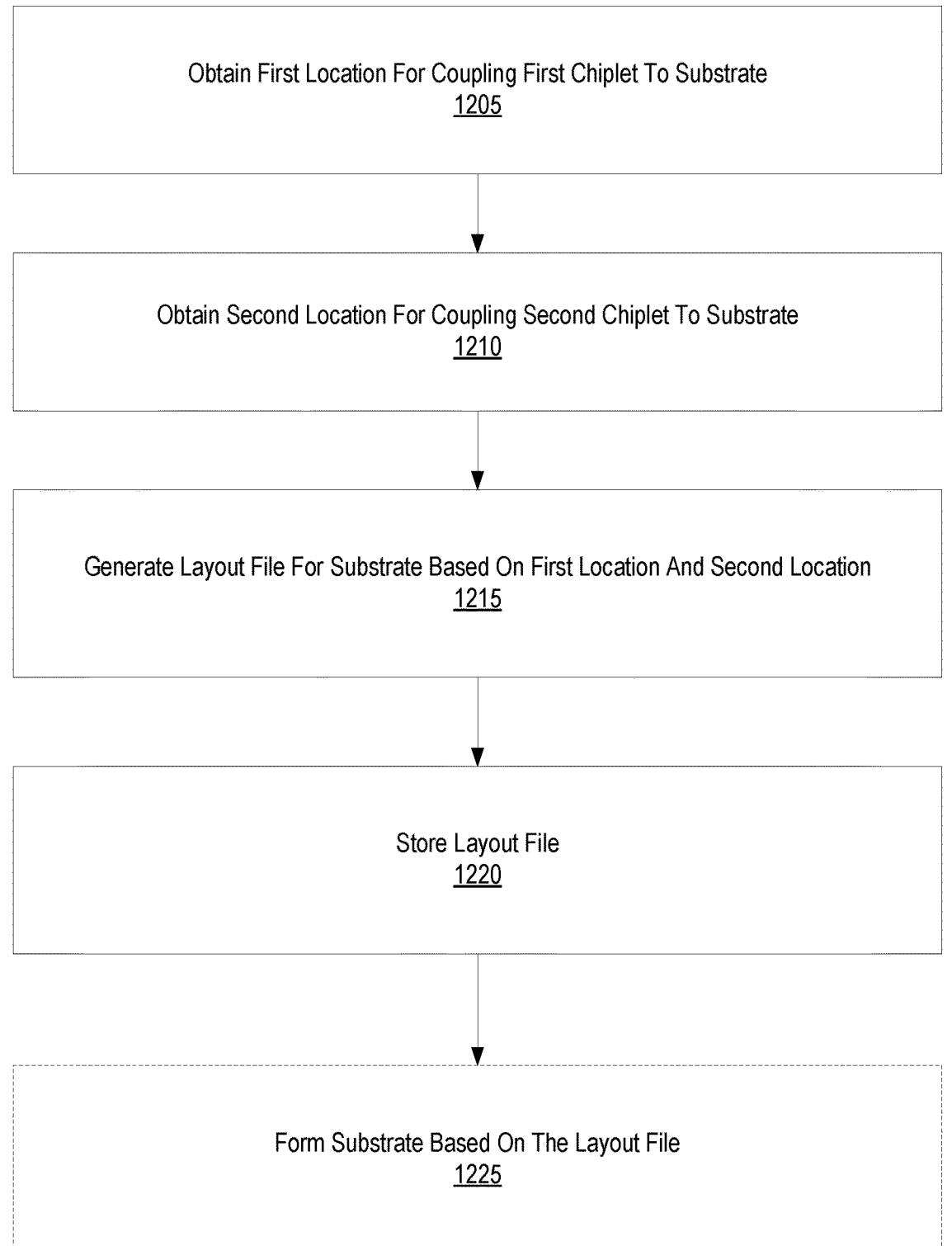
FIG. 12 is a flowchart of an example method for manufacturing a semiconductor assembly device designed with a reusable substrate template according to some implementations.

For further explanation, FIG. 12 is a flowchart of an example method for manufacturing a semiconductor assembly having a substrate formed from a template 100. In various implementations, the method described in conjunction with FIG. 12 is performed by an electronic design automation (EDA) system. In various implementations an EDA system comprises a processor and a memory in which instructions are encoded that, when executed by the processor, cause the processor to obtain information describing placement of one or more components on a substrate and to generate one or more layout files specifying positioning of the one or more components on the substrate, as well as connections between components on the substrate. In some implementations, the EDA system is like the computing device 1000 further described above in conjunction with FIG. 10.

The EDA system obtains 1205 a first location 110 on a substrate for coupling a first chiplet to the substrate and obtains 1210 a second location 120 on the substrate for coupling one or more additional chiplets to the substrate. In various implementations, the EDA system obtains 1205 the first location 110 and obtains 1210 the second location 120 from one or more inputs provided by a user, such as a designer. For example, the EDA system receives dimensions of the substrate from the user and receives information identifying a position of the first location 110 and a position of the second location 120 on the substrate from the user. One or more inputs received from the user specify dimensions of the first location 110 and dimensions of the second location 120. In another example, the EDA system retrieves positions of the first location 110 and of the second location 120 on the substrate from stored data. For example, the EDA system retrieves a template specifying the first location 110 and the second location 120 on a substrate. The EDA system retrieves the template based on a selection of the template from a user in some implementations, while in other implementations the EDA system retrieves the template based on one or more stored instructions. In other implementations, the EDA system obtains 1205 the first location 110 and obtains 1210 the second location based on one or more criteria obtained by the EDA system and one or more rules maintained by the EDA system or received by the EDA system. Example criteria include characteristics (e.g., dimensions, functionality, type) of one or more additional chiplets or characteristics (e.g., dimensions, functionality, type) of a first chiplet. Example rules obtained by the EDA system include a number of additional chiplets, a type of die-to-die interface between the first chiplet and one or more additional chiplets, spacing between the first chiplet and one or more additional chiplets on a substrate, or other rules. The EDA system determines the first location 110 and the second location 120 subject to one or more of the rules obtained or maintained by the EDA system.

In some implementations, the first location 110 is obtained 1205 from a selection of a stored template from a set of templates. Similarly, the second location 120 is obtained 1210 from selection of the stored template from the set of templates. Each template of the set defines the first location 110 for coupling a first chiplet to a substrate and a second location 120 for coupling one or more additional chiplets to the substrate. Different templates of the set include different dimensions for the second location 120 for coupling one or more additional chiplets to the substrate.

As further described above in conjunction with FIG. 1, the second location 120 includes a power region 125. The power region 125 specifies a location on the substrate for a power interface that includes connections for coupling one or more additional chiplets to power via the substrate. In various implementations, the connections providing power to the one or more additional chiplets are solder bumps, with the substrate including solder bumps in the first location specified by the power region 125. Other example connection types include conductive pillars, pins, pads, one or more silicon bridges, one or more silicon interposers, and InFO connections. The power region 125 specifies a density of the solder bumps or a spacing between the solder bumps in various implementations. Additionally, the second location 120 includes an interface region 127 to allow communication between an additional chiplet in the second location 120 and a first chiplet in the first location 110. The template 100 specifies coordinates on the substrate for connections in the interface region 127 where a die-to-die interface of the additional chiplet is coupled to the substrate. Connections in the interface region 127 are coupled to connections in an interface region 117 of the first location 110 to enable communication between the first chiplet and the additional chiplet. Different templates 100 include different dimensions for the second location 120 where one or more additional chiplets are coupled to the substrate. In various implementations, different templates 100 of the set include one or more different dimensions for the power region 125 on the substrate included in the second location 120.

From the first location 110 and the second location 120, the EDA system generates 1215 a layout file for the substrate. As further described above in conjunction with FIG. 1, the layout file includes coordinates on the substrate for the first location 110 for coupling the first chiplet to the substrate and coordinates within the first location 110 for placement of connections for coupling the first chiplet to the substrate within the first location 110. The layout file also includes coordinates on the substrate for the second location 120 and for placement of connections for the one or more die-to-die interfaces within the interface region 127 of the second location 120 on the substrate based on the selected template. Additionally, the layout file includes coordinates on the substrate for connections for the power interface within the power region 125 of the second location 120 on the substrate based on the selected template. In various implementations, the layout file is a GDSII file specifying positions of the first location 110 and the second location 120 relative to a reference location of the substrate and coordinates for the connections within the first location 110, within the power region 125, and within the interface region 127 relative to the reference location of the substrate, as well as connections between different connections through the substrate (e.g., connections between connections in the interface region 127 and connections in the interface region 117). In other implementations, the layout file is alternative fabrication instructions for the substrate including information specifying positions of the first location 110 and of the second location 120 on the substrate and coordinates within the first location 110 and within the second location 120 for connections to couple a first chiplet and an additional chiplet, respectively, to the substrate. In some implementations, the layout file specifies the location on the substrate of the second location 120 relative to a location on the substrate of the first location 110. In other implementations, the layout file specifies the location on the substrate of the second location 120 relative to a location on the substrate of the first location 110. The layout file also includes instructions for placement and routing of conductive traces that couple connections in the interface region 117 of the first location 110 to connections in the interface region 127 of the second location 120.

In some implementations, a specialized interface region 705 is identified within the first location 110 for a second die-to-die interface having one or more characteristics for coupling to at least one additional chiplet. The layout file further includes coordinates on the substrate for connections within the second interface region of the first location and coordinates on the substrate for connections within a second interface region that is within the interface region of the second location, connections within the second interface region coupled to connections within the second interface region in such implementations. Inclusion of the specialized interface region 705 within the first location 110 to allow use of the second die-to-die interface is further described above in conjunction with FIG. 7.

The EDA system stores 1220 the generated layout file. For example, the EDA system stores 1220 the generated layout file in a non-volatile storage device. However, in other implementations, the EDA system stores the generated layout file in another type of storage device. Storing 1220 the generated layout file allows the EDA system to subsequently retrieve the layout file for modification or to transmit to one or more devices to fabricate a substrate having the first location 110 for coupling the first chiplet and the second location 120 for coupling one or more additional chiplets in locations specified by the layout file, as well as having connections within the first location 110 and within the second location 120 at coordinates specified by the layout file.

In some implementations, the method optionally includes forming 1225 the substrate based on the layout file. Forming 1225 the substrate includes forming the connections for the one or more die-to-die interfaces at the coordinates on the substrate within the interface region 127 of the second location 120 and forming the connections for the power interface at the coordinates on the substrate within the power region 125 of the second location 120. In various implementations, forming 1225 the substrate also includes forming the connections at the coordinates within the first location 110 specified by the layout file. In various implementations, the first chiplet is also coupled to the first location 110 and an additional chiplet is coupled to the second location 120. The additional chiplet is selected from a set of additional chiplets in various implementations. Each additional chiplet of the set of additional chiplets has dimensions that do not exceed the dimensions for the second location 120 for which the layout file was generated 1215. The additional chiplet coupled to the second location 120 has at least one dimension that does not exceed a corresponding dimension of the second location 120, as further described above in conjunction with FIGS. 2-7.

A substrate formed from the layout file includes connections on for a first chiplet in a first location 110 and connections on the substrate for one or more additional chiplets in a second location 120 on the substrate. The second location 120 of the substrate includes an interface region 127 for connections for one or more die-to-die interfaces between the first chiplet and the one or more additional chiplets. The second location 120 also includes a power region 125 on the substrate within the second location for a power interface including connections for the one or more additional chiplets, and dimensions for the power interface. The substrate further includes connections for the one or more die-to-die interfaces within the interface region 127 of the second location 120 on the substrate based on the selected template. Additionally, the substrate includes connections for the power interface within the power region of the second location 120.

The substrate formed from the layout file allows second chiplets having different dimensions to be coupled to the second location 120 and to be coupled to power and to ground through connections in the second location 120. Similarly, the second location 120 of the substrate enables communication between a first chiplet in the first location 110 and second chiplets having different dimensions through connections in the interface region 127 of the second location 120 and connections in the interface region 117 of the first location 110. The connections in the second location 120 of the substrate allow second chiplets having different dimensions that do not exceed dimensions of the second location 120 to be coupled to the substrate and to communicate with the first chiplet and to receive power and ground through the substrate. This ability to receive second chiplets having a range of dimensions allows the substrate formed from the layout file to be more easily used for different semiconductor assemblies in contrast to conventional substrates that are formed to accommodate specific second chiplets. As conventional substrates are formed for specific chiplets, other chiplets with different dimensions that the specific chiplets are unable to be coupled to a conventional substrate. In contrast, forming a substrate from the layout file results in the substrate having connections in locations that are capable of accommodating chiplets having a range of dimensions, simplifying reuse of a substrate from a layout file across different semiconductor assemblies or with different second chiplets providing similar functionality but having different physical dimensions.

While FIGS. 1-12 describe a layout file specifying the second location 120 to allow different chiplets with different dimensions to be coupled to the second location 120, in various implementations, a template or a layout file specifies the first location 110 so different first chiplets having different dimensions are capable of being coupled a substrate through the first location 110. Thus, the description of the second location 120 of a substrate formed from a template in conjunction with FIGS. 2-10 is also applicable to the first location 110 in various embodiments. In some implementations, a template specifies dimensions and connections of both the first location 110 and the second location 120, allowing a substrate formed from the template to accommodate first chiplets having a range of dimensions bounded by dimensions of the first location 110 and to accommodate second chiplets having a range of dimensions bounded by dimensions of the second location 120. In other implementations, a template specifies dimensions of the first location 110, allowing a substrate formed from the template 100 to accommodate first chiplets having a range of dimensions bounded by dimensions of the first location 110, while having a second location 120 having dimensions and connections for a specific second chiplet. This allows the teachings described above in conjunction with FIGS. 1-11 to be applied to a first location 110 of a substrate, a second location 120 of a substrate, or both a first location 110 and a second location 120 of a substrate to form substrates capable of accommodating first chiplets or second chiplets having a range of dimensions.

A semiconductor assembly is formed from the substrate that was formed from the layout file includes the first chiplet coupled to the connections on the substrate in the first location 110 and includes an additional chiplet coupled to at least a set of the connections within the interface region 127 of the second location 120 on the substrate and to a set of the connections in the power region 125 on the substrate within the second location 120. In some implementations, at least a subset of the connections on the substrate in the second location 120 for coupling one or more additional chiplets to the substrate are not coupled to the additional chiplet. Hence, different additional chiplets having dimensions that do not exceed dimensions of the second location 120 are capable of being coupled to the substrate in the second location 120. So, the dimensions of the second location 120 form limits for dimensions of additional chiplets capable of being coupled to the substrate in the second location 120. In some implementations, the additional chiplet is selected from a set of additional chiplets, where each additional chiplet of the set has dimensions that do not exceed dimensions of the second location 120. In some implementations, the additional chiplet has at least one dimension that is smaller than a corresponding dimension of the second location 120.

In some implementations, the semiconductor assembly further includes a second additional chiplet coupled to an additional set of the connections within the interface region 127 of the second location 120 on the substrate and coupled to an additional set of the connections in the power region

125 on the substrate within the second location 120. Combined dimensions of the additional chiplet and the second additional chiplet are within a range of dimensions that does not exceed the dimension for the second location 120. The semiconductor assembly further includes a layer of material coupled to the subset of the connections on the substrate in the second location 120 for coupling one or more additional chiplets to the substrate that are not coupled to the additional chiplet in some implementations. Further, in some implementations, the substrate includes connections within a specialized interface region 805 of the first location 110 and connections within a specialized interface region 810 of the second location 120, with the specialized interface region 805 and the specialized interface region 810 for implementing a second die-to-die interface having one or more characteristics. Connections within the specialized interface region 805 of the first location 110 are coupled to connections within the specialized interface region 810 of the second location 120. The additional chiplet is coupled to a set of the connections within the specialized interface region 810 of the second location 120 in some implementations.

Figure 13:
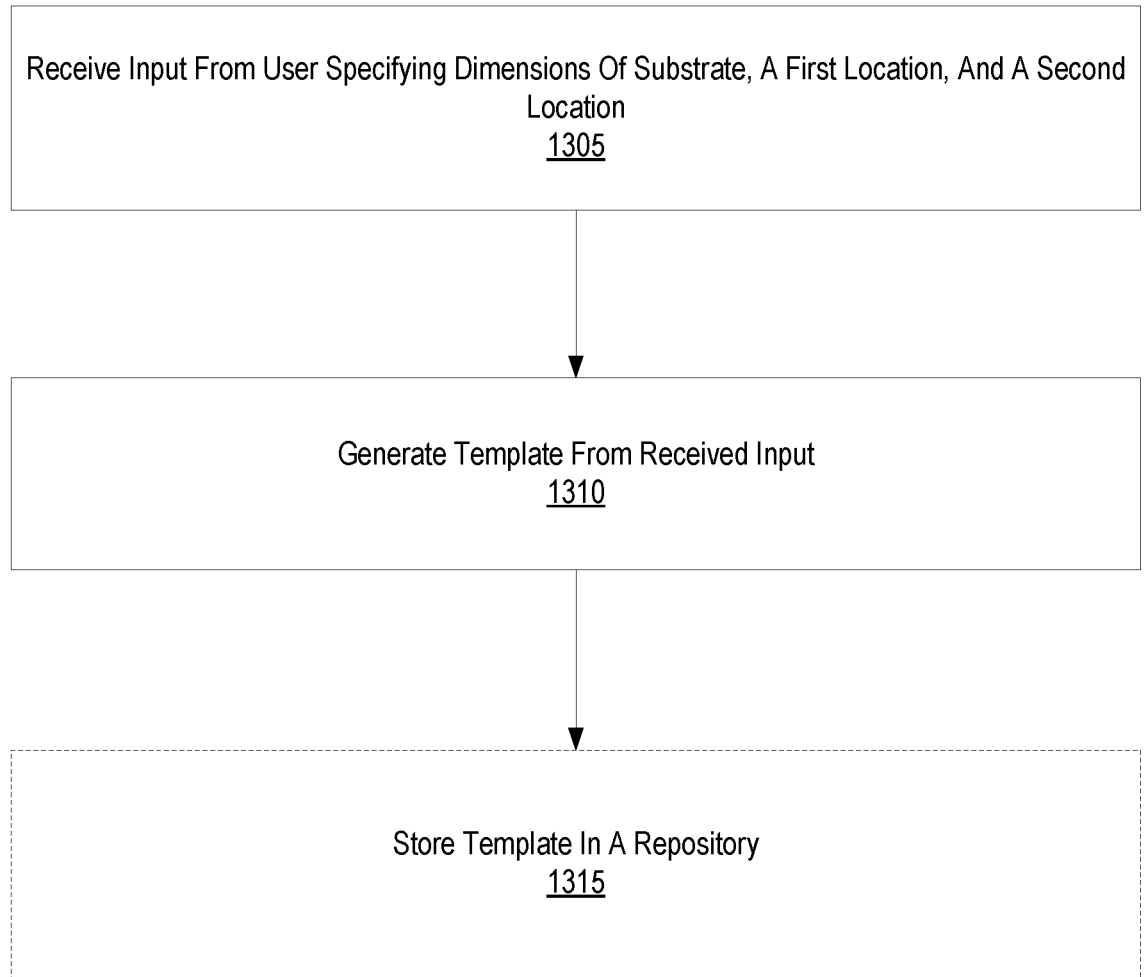
FIG. 13 is a flowchart of an example method for generating a template for forming a substrate according to some implementations.

For further explanation, FIG. 13 is a flowchart of an example method for generating a template 100 for forming a substrate. In various implementations, the method described in conjunction with FIG. 13 is performed by an electronic design automation (EDA) system. The EDA system receives 1305 input from a user that specifies dimensions of a substrate. The user input also specifies a first location 110 on the substrate for coupling a first chiplet to the substrate and specifies a second location 120 on the substrate for coupling one or more additional chiplets to the substrate. The second location 120 comprises an interface region on the substrate for one or more die-to-die interfaces between the first chiplet and the one or more additional. Additionally, the second location 120 includes a power region 125 that includes a power interface, the power interface including connections for the one or more additional chiplets.

In some implementations, the user input further specifies a specialized interface region 705 within the first location 110 and a specialized interface region 710 within the second location 120 for a second die-to-die interface. As further described above in conjunction with FIG. 7, connections in the specialized interface region 705 are coupled to connections in the specialized interface region 710 through conductive pathways in the substrate (which are specified by the user input). Using connections in the specialized interface region 705 and connections in the specialized interface region 710, the first chiplet and an additional chiplet communicate using the second die-to-die interface. As further described above in conjunction with FIG. 7, the second die-to-die interface has one or more characteristics for communication between the first chiplet and the second chiplet.

In some implementations, the user input further specifies a sideband region 815 in the first location 110 and a second sideband region 820 in the second location 120, as further described above in conjunction with FIGS. 8 and 11. Connections within the sideband region 815 in the first location 110 are coupled to connections within the second sideband region 820 in the second location 120. The sideband region 815 in the first location 110 and the sideband region 820 in the second location 120 are for a sideband interface between the first chiplet and one or more second chiplets augmenting a die-to-die interface, as further described above in conjunction with FIG. 8. In some implementations, the user input additionally or alternatively specifies an external connection region 825 in the second location 120. The external connection region 825 includes a connection for coupling to an additional chiplet and a connection pathway 1110 through the substrate coupling the connection to an outside connection 1115. As further described above in conjunction with FIGS. 8 and 11, the external connection region 825 allows a component external to an integrated circuit device including the substrate to be directly coupled to an additional chiplet.

Based on the received input, the EDA system generates 1310 a template for the substrate including the first location and the second location, as further described above in conjunction with FIGS. 1, 7, and 8. In some implementations, the EDA system stores 1315 the template in a repository for subsequent retrieval. In some implementations, the repository is an online system hosting a plurality of templates. Storing the template in the online system allows EDA systems, or other computing devices, to access the template from various locations. This simplifies use of the template for forming a substrate.

Figure 14:
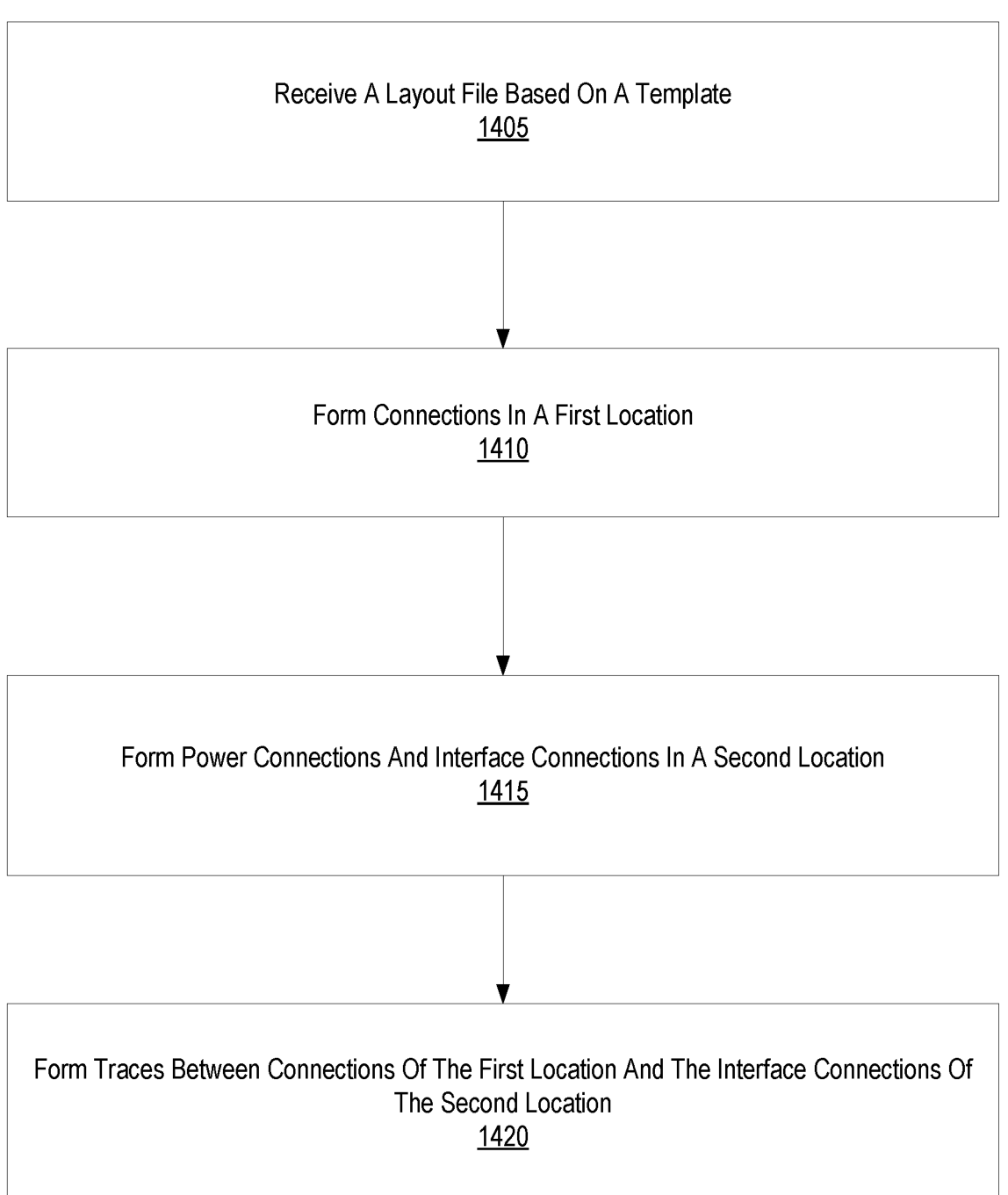
FIG. 14 sets forth a flow chart illustrating an example method for fabricating a semiconductor assembly from a layout file that is based on a template described herein.

FIG. 14 sets forth a flow chart illustrating an example method for fabricating a semiconductor assembly from a layout file that is based on a template described herein. The method of FIG. 14 includes receiving 1405 a layout file of a substrate. A fabrication tool can receive a layout file in a variety of ways. For example, the fabrication tool can load a layout file from a storage location or network location. The layout file specifies a first location for coupling a first chiplet to the substrate and a second location for coupling one or more additional chiplets to the substrate. The second location includes an interface region and a power region. The interface region includes a plurality of interface connections for one or more die-to-die interfaces of the one or more additional chiplets. The power region includes power connections for the one or more additional chiplets.

The method of FIG. 14 also includes forming 1410 connections at coordinates on the substrate within the first location included in the layout file. Such connections may be formed as solder bumps applied onto pads of the substrate. Prior to applying bumps to pads, the formation tool may place a variety of vias, traces, and pads to support application of solder bumps to pads. Additional layers typical to substrate formation can also be applied before or after the formation of connections as described here.

The method of FIG. 14 also includes forming 1415 the interface connections at coordinates on the substrate within the interface region of the second location included in the layout file and forming the power connections for the power interface at coordinates on the substrate within the power region of the second location included in the layout file.

The method of FIG. 14 also includes forming 1420 one or more traces between connections of the first location and interface connections of the second location. In some examples, forming traces between the connections in the two locations can be carried out prior to the application of the connections themselves. Once the substrate is formed, chiplets can be placed in the first and second locations according to a particular design.

In view of the explanations set forth above, readers will recognize that leveraging a set of templates to generate a layout file for a substrate allows the layout file to be used for generating substrates for semiconductor assemblies including additional chiplets with different dimensions coupled to a first chiplet via the substrate. The layout file allows coordinates on the substrate for connections that couple the first chiplet and the one or more additional chiplets to the substrate to be used for coupling additional chiplets that have dimensions within a range specified by the layout file, allowing different sized additional chiplets to be coupled to the substrate. Hence, the layout file increases a range of additional chiplets that can be coupled to the substrate, providing greater flexibility in design options for semiconductor assembly fabrication. Substrates generated from a layout file also reduce an amount of time for manufacturing a semiconductor assembly by allowing different combinations of chiplets with different dimensions supported by a substrate to be coupled to an existing substrate, unlike conventional manufacturing methods where a substrate is custom-designed and manufactured for a specific combination of chiplets. Allowing reuse of a common substrate for different combinations of chiplets with different dimensions increases a number of chiplets that can be used for a semiconductor assembly and allows the common substrate to be used without forming different substrates that are specifically designed for dimensions of a specific combination of chiplets.

Aspects of the present disclosure may be implemented as a system, a method, and/or a computer program product. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

It will be understood from the foregoing description that modifications and changes can be made in various implementations of the present disclosure. The descriptions in this specification are for purposes of illustration only and are not to be construed in a limiting sense. The scope of the present disclosure is limited only by the language of the following claims.

What is claimed is:

1. A substrate comprising:

a first location for coupling one or more chiplets to the substrate, the first location having dimensions that bound dimensions of chiplets capable of being coupled to the substrate in the first location, the first location including an interface region and a power region, the interface region including connections for one or more die-to-die interfaces and the power region including a power interface having connections for the one or more chiplets;

a second location for coupling one or more additional chiplets to the substrate, the second location having dimensions that bound dimensions of chiplets capable of being coupled to the substrate in the second location, the second location including an interface region and a power region, the interface region including connections for one or more die-to-die interfaces and the power region including a power interface having connections for the one or more additional chiplets; and connections within the substrate coupling the interface region in the first location to the interface region in the second location.

2. The substrate of claim 1, wherein each of the first location and the second location is configured to receive a plurality of different chiplets having combined dimensions that do not exceed the dimensions of the respective location.

3. The substrate of claim 1, wherein each of the first location and the second location is configured to receive a plurality of different chiplets having different widths and a combination of the different widths does not exceed a width of the respective location.

4. The substrate of claim 1, wherein each of the first location and the second location is configured to receive a plurality of different chiplets having different lengths and a combination of the different lengths does not exceed a length of the respective location.

5. The substrate of claim 1, wherein each of the first location and the second location includes a sideband region, and wherein the substrate includes connections between the sideband region of the first location and the sideband region of the second location for a sideband interface between a chiplet in the first location and another chiplet in the second location, the sideband interface augmenting a die-to-die interface.

6. The substrate of claim 1, wherein the first location includes an external connection region including connections coupling a chiplet to one or more components external to a semiconductor assembly including the substrate, and the substrate includes a connection pathway from a connection in the external connection region to an outside connection.

7. A semiconductor assembly comprising:

a substrate comprising:

a first location for coupling one or more chiplets to the substrate, the first location having dimensions that bound dimensions of chiplets capable of being coupled to the substrate in the first location, the first location including an interface region and a power region, the interface region including connections for one or more die-to-die interfaces and the power region including a power interface having connections for the one or more chiplets;

a second location for coupling one or more additional chiplets to the substrate, the second location having dimensions that bound dimensions of chiplets capable of being coupled to the substrate in the second location, the second location including an interface region and a power region, the interface region including connections for one or more die-to-die interfaces and the power region including a power interface having connections for the one or more additional chiplets;

connections within the substrate coupling the interface region in the first location to the interface region in the second location; and at least one chiplet coupled to at least a subset of the connections in the interface region of the first location and to a subset of the connections in the power region of the first location, the at least one chiplet having dimensions that do not exceed dimensions of the first location.

8. The semiconductor assembly of claim 7, further comprising:

at least one additional chiplet coupled to the second location.

9. The semiconductor assembly of claim 7, wherein each of the first location and the second location is configured to receive a plurality of different chiplets having combined dimensions that do not exceed the dimensions of the respective location.

10. The semiconductor assembly of claim 7, wherein each of the first location and the second location is configured to receive a plurality of different chiplets having different widths and a combination of the different widths does not exceed a width of the respective location.

11. The semiconductor assembly of claim 7, wherein each of the first location and the second location is configured to receive a plurality of different chiplets having a length and a combination of the lengths does not exceed a length of the respective location.

12. The semiconductor assembly of claim 11, wherein each of the plurality of different chiplets have a different length.

13. The semiconductor assembly of claim 7, wherein a subset of the connections in the power region of the first location are not coupled to a chiplet.

14. The semiconductor assembly of claim 7, wherein a subset of connections in the interface region of the second location on the substrate are not coupled to a chiplet.

15. The semiconductor assembly of claim 7, wherein each of the first location and the second location includes a sideband region, and wherein the substrate includes connections between the sideband region of the first location and the sideband region of the second location for a sideband interface between a chiplet in the first location and another chiplet in the second location, the sideband interface augmenting a die-to-die interface.

16. The semiconductor assembly of claim 7, wherein the first location includes an external connection region including connections coupling a chiplet to one or more components external to the semiconductor assembly including the substrate, and wherein the substrate includes a connection pathway from a connection in the external connection region to an outside connection.

* * * * *